United States Patent [19]
Gerlach

[11] Patent Number: 6,122,157
[45] Date of Patent: Sep. 19, 2000

[54] APPARATUS AND METHOD FOR SURGE PROTECTING AN ELECTRICAL LOAD CONNECTED TO AN AC POWER DISTRIBUTION SYSTEM

[76] Inventor: Michael J. Gerlach, 6149324 Sunnyoak Dr., Riverview, Fla. 33569

[21] Appl. No.: 09/255,685

[22] Filed: Feb. 23, 1999

Related U.S. Application Data

[63] Continuation-in-part of application No. 09/067,118, Apr. 27, 1998.

[51] Int. Cl.[7] .................................................. H02H 1/00
[52] U.S. Cl. ........................ 361/124; 361/111; 361/93.8; 361/118
[58] Field of Search ........................ 361/111, 56, 91.1, 361/93.1, 93.8, 93.9, 117–118, 124, 126–127; 340/662, 643, 635

[56] References Cited

U.S. PATENT DOCUMENTS

| | | | |
|---|---|---|---|
| 4,152,743 | 5/1979 | Comstock | 361/56 |
| 4,538,201 | 8/1985 | Wuyts et al. | 361/124 |
| 4,642,733 | 2/1987 | Schacht | 361/363 |
| 4,669,027 | 5/1987 | Elsner et al. | 361/111 |
| 4,794,485 | 12/1988 | Bennett | 361/127 |
| 4,907,118 | 3/1990 | Hames | 361/56 |
| 4,912,590 | 3/1990 | Misencik et al. | 361/56 |
| 5,053,919 | 10/1991 | Schacht | 361/363 |
| 5,136,460 | 8/1992 | Misencik et al. | 361/117 |
| 5,166,855 | 11/1992 | Turner | 361/119 |
| 5,272,588 | 12/1993 | Motoori | 361/119 |
| 5,303,116 | 4/1994 | Grotz | 361/111 |
| 5,321,575 | 6/1994 | Shilo | 361/56 |
| 5,384,428 | 1/1995 | Luu | 174/66 |
| 5,422,779 | 6/1995 | Borkowicz et al. | 361/119 |
| 5,457,600 | 10/1995 | Campbell et al. | 361/643 |
| 5,583,734 | 12/1996 | McMills et al. | 361/124 |
| 5,596,479 | 1/1997 | Campbell et al. | 361/643 |
| 5,621,602 | 4/1997 | Winkelmann | 361/104 |
| 5,768,081 | 6/1998 | Cohen et al. | 361/119 |
| 5,790,359 | 8/1998 | Kapp et al. | 361/106 |
| 5,808,850 | 9/1998 | Carpenter, Jr. | 361/127 |
| 5,914,662 | 6/1999 | Burleigh | 340/635 |
| 5,914,845 | 6/1999 | Chase | 361/111 |

*Primary Examiner*—Michael J. Sherry
*Attorney, Agent, or Firm*—Holland & Knight LLP

[57] ABSTRACT

An AC power distribution system employs a method (900) and apparatus (400) for surge protecting an electrical load connected thereto. The apparatus is coupleable to at least three conductors of the AC power distribution system. A first circuit path (305) of the apparatus electrically couples a first conductor of the AC power distribution system to a second conductor of the AC power distribution system. The first circuit path includes a first thermal protector (337) electrically in series with and operably thermally coupled to a first surge protection device (331). A second circuit path (307) of the apparatus electrically couples the first conductor of the AC power distribution system to a third conductor of the AC power distribution system. The second circuit path includes a second thermal protector (339) electrically in series with and operably thermally coupled to a second surge protection device (333). A third circuit path (309) of the apparatus electrically couples the second conductor of the AC power distribution system to the third conductor of the AC power distribution system. The third circuit path includes a third surge protection device (335) electrically in series with and operably thermally coupled to at least one of the first thermal protector and the second thermal protector.

69 Claims, 8 Drawing Sheets

APPARATUS AND METHOD FOR SURGE PROTECTING AN ELECTRICAL LOAD CONNECTED TO AN AC POWER DISTRIBUTION SYSTEM

CROSS-REFERENCE TO RELATED APPLICATIONS

This application is a continuation-in-part of co-pending U.S. patent application Ser. No. 09/067,118, filed Apr. 27, 1998, the specification and drawings of which are expressly incorporated herein by reference in their entirety to form part of the present disclosure.

FIELD OF THE INVENTION

The invention relates generally to apparatuses and methods for protecting alternating current (AC) power distribution systems and loads connected thereto from being damaged and/or creating a fire or electrical hazard upon being subjected to transient overvoltage conditions. More particularly, the present invention relates to economical and effective surge protection apparatuses and methods which provide thermal and/or overcurrent protection for one or more varistors or other surge protection devices. In addition, the present invention relates to thermal protectors that provide thermal protection in such surge protection apparatuses and methods.

BACKGROUND OF THE INVENTION

Surge protectors are used in a wide variety of commercial and consumer applications to protect AC power distribution systems and various types of electrical and electronic equipment that receive operating power from such systems. AC power distribution systems and the electrical loads that receive power from such systems can be subjected, often repeatedly, to a potentially damaging and/or hazardous condition commonly referred to as a "power surge." A power surge is characterized by a sudden and dramatic transient increase in the magnitude of voltage one would normally expect to encounter at a given point in the AC power distribution system. Typically caused by lightning strikes or equipment failures of some kind, power surges can damage or destroy electrical insulation systems as well as motors, switches, control devices, computer systems, and all other types of electrical or electronic equipment. Moreover, such damage may result in fire and/or electrical shock hazards capable of causing death, serious injury, and/or ancillary property damage extending beyond the limits of the electrical system or equipment subjected to the power surge itself.

In order to prevent or mitigate the effects of power surges, various types of surge protectors are well known. Surge protectors typically include one or more devices commonly referred to as transient voltage surge suppressors (TVSSs), or more recently, as surge protection devices (SPDs). As used herein and in the appended claims, the term "surge protection device" is to be construed broadly to refer to any type of device which, in normal operation, exhibits a relatively high electrical impedance, but which, upon being subjected to a voltage of sufficiently high magnitude, exhibits a significantly lower impedance and conducts electrical current relatively readily. Non-limiting examples of various types of SPDs include varistors, silicon avalanche diodes, zener diodes, selenium cells, gas discharge tubes, and high voltage capacitors, of which the metal oxide varistor (MOV) is favored for many low voltage applications, such as in AC power distribution systems having normal, nominal operating voltages of about six hundred volts AC (600 VAC) or less.

In addition to SPDs, surge protectors may optionally include one or more thermal or overcurrent protectors. As used herein and in the appended claims, the term "thermal protector" is to be construed broadly to refer to any type of device which, in normal operation, exhibits a relatively low electrical impedance, but which, upon being subjected to temperatures above a temperature threshold, exhibits a significantly higher impedance and substantially prevents the flow of electrical current. Non-limiting examples of various types of thermal protectors include thermal fuses, bimetal thermostats, thermal cutoffs, thermal cutouts, and thermal links.

Thermal protectors are constructed and function in a variety of ways. In some implementations, a mechanically biased element, such as a spring or a flexed piece of metal, is soldered to one end of the device to be protected (e.g., an SPD). When the protected device heats up to a melting temperature of the solder, the solder melts and the biased element recoils or reverts back to its unbiased state, opening the circuit path and abating overheating of the protected device. One such thermal protector, a flexed piece of metal, is described in U.S. Pat. No. 5,790,359. Another such thermal protector, a "MICROTEMP" thermal fuse that is commercially available from Therm-O-Disc, Inc. of Mansfield, Ohio, is mentioned briefly in U.S. Pat. No. 5,621,602. Although both thermal protectors provide desired thermal protection of SPDs, they do so at the expense of additional elements and cost. That is, such thermal protectors require both a mechanically biased member and solder to connect the mechanically biased member to the protected device, such that when the solder melts the biased member is released to open the circuit.

In other thermal protector implementations, such as bimetal thermostats, a composite piece of metal is thermally coupled to one of the devices to be protected. The composite piece of metal is fabricated using two metals (hence the name "bimetal") characterized by differing coefficients of thermal expansion. As the protected device heats up, the composite piece of metal bends due to the interaction of the two pieces of metal expanding at different rates, such that upon the protected device reaching a temperature threshold, the composite piece of metal is bent sufficiently to open the circuit. Although providing some thermal protection, bimetal thermostats only temporarily open the circuit because as the protected device cools (e.g., after the circuit has been opened for a short length of time), the composite piece of metal also cools and bends back to its original position, thereby permitting current flow. Permitting such current flow could be catastrophic when the reason the temperature of the bimetal thermostat rose in the first place was the resistive heating of a failing SPD. In addition, bimetal thermostats are relatively expensive due their unique bimetal compositions.

FIG. 1 is a block diagram of a typical prior art electrical surge protector 100 for use in an AC power distribution system. The surge protector 100 includes a first SPD 107 connected between the neutral conductor 103 and the ground conductor 105 of the AC power distribution system, a second SPD 108 connected between the neutral conductor 103 and one end of a fuse 113, and a third SPD 109 connected between the ground conductor 103 and one end of the fuse 113. The fuse 113 provides overcurrent protection to SPDs 108 and 109, and couples SPDs 108 and 109 to the line conductor 101 of the AC power distribution system.

One problem with the surge protector 100 of FIG. 1 is that when the SPDs 107–109 reach the ends of their useful lives, they may cause undesirable effects in the AC power distribution system. An SPD's end-of-life can be caused by a variety of phenomena, such as temporary or permanent failure of the neutral conductor 103, improper installation of the SPD, lightning strikes, common voltage transients, and normal device fatigue. Undesirable effects in the AC power distribution system that may be caused by one or more SPDs reaching their end lives include removal of a branch circuit from the distribution circuit, removal of the distribution circuit from the service entrance, shutdown of a building's power system, high neutral-to-ground current flow, nuisance tripping of a facility's ground fault protection and fire.

As an SPD reaches the end of its useful life, the SPD (e.g., SPD 108) can become a low resistance (instead of its typical high impedance) at normal operating voltages and begin heating very quickly. If the resistance of the SPD 108 is lower than normal, but high enough to draw an amount of current just below the actuation rating of the fuse 113, the SPD 108 will continue to heat, eventually leading to a thermal runaway condition that could result in melting or arcing of the SPD 108. In addition, thermal runaway is even more likely for the SPD 107 between neutral 103 and ground 105 because the fuse 113 does not provide overcurrent protection for excessive neutral-to-ground currents.

FIG. 2 is block diagram of another typical prior art electrical surge protector 200 that attempts to overcome some of the limitations of the surge protector 100 of FIG. 1. As shown, the surge protector 200 of FIG. 2 includes three circuit paths. The first circuit path couples the line conductor 201 to the neutral conductor 203 and includes a first fuse 213, a first thermal cutout 215, and a first SPD 207 electrically in series with one another. The second circuit path couples the line conductor 201 to the ground conductor 205 and includes a second fuse 217, a second thermal cutout 219, and a second SPD 209 electrically in series with one another. The third circuit path couples the neutral conductor 203 to the ground conductor 205 and includes a third fuse 221, a third thermal cutout 223, and a third SPD 211 electrically in series with one another. Each fuse 213, 217, 221 provides overcurrent protection to a respective one of the SPDs 207, 209, 211. In an analogous manner, each thermal cutout 215, 219, 223 provides thermal protection to a respective one of the SPDs 207, 209, 211. Thus, in contrast to the surge protector 100 of FIG. 1, when an SPD (e.g., SPD 211) reaches the end of its useful life, overheating of the SPD 211 is abated by the respective thermal cutout 223, which is thermally coupled to the SPD 211. When the thermal cutout 223 reaches a predetermined temperature, the thermal cutout opens and no current flows through the SPD 211. In addition, the surge protector 200 of FIG. 2 provides both thermal and overcurrent protection to the SPD 211 coupled between the neutral conductor 203 and the ground conductor 205.

Although the surge protector 200 of FIG. 2 appears to solve all the problems of the surge protector 100 of FIG. 1, such is not the case. One problem that exists in the surge protector 100 of FIG. 1, and remains in the surge protector of FIG. 2, is the difficulty of detecting a fault in the neutral-to-ground circuit path. During normal operation of the AC power distribution system, the voltage present from neutral 203 to ground 205 can vary from zero volts AC (0 VAC) to forty volts AC (40 VAC). Consequently, simply sensing the voltage from neutral 203 to ground 205 to detect a failure of an element (e.g., SPD 211, thermal cutout 223, or fuse 221) in the neutral-to-ground circuit path is uninformative. An in-line current meter could be added to the neutral-to-ground circuit path, but adding such circuitry adds cost and complexity to the surge protector 200 and such circuitry may be damaged by voltage transients.

In addition to sharing surge protector 100's difficulty of detecting a fault in the neutral-to-ground circuit path, the surge protector 200 of FIG. 2 has considerably more components than its FIG. 1 counterpart, and accordingly is more expensive to manufacture. That is, although the circuit 200 of FIG. 2 provides much more thermal and overcurrent protection than does the circuit 100 of FIG. 1, it does so at the cost of more parts. The surge protector 200 of FIG. 2 not only requires three thermal protectors (i.e., thermal cutouts 215, 219, 223) not present in the surge protector 100 of FIG. 1, but also requires three overcurrent protectors (i.e., fuses 213, 217, 221), which is two more than the single overcurrent protector (i.e., fuse 113) used in the surge protector 100 of FIG. 1.

Therefore, a need exists for an apparatus and method for surge protecting an electrical load connected to an AC power distribution system that provide thermal and overcurrent protection for the SPDs, while utilizing a minimal number of components to do so. There is a further need for such a surge protection apparatus and method that also facilitates simple detection of a fault in the neutral-to-ground circuit path. There is a still further need for an economical thermal protector for use in such a surge protection apparatus and method that permanently reduces current flow when the thermal protector reaches an undesired temperature level.

SUMMARY OF THE INVENTION

The present invention overcomes the foregoing problems and limitations of the prior art by providing, in one aspect thereof a surge protection apparatus and method in which surge protection is provided between each pair of conductors of an AC power distribution system by means of separate surge protection devices (SPDs) electrically coupled between respective pairs of conductors and in which each SPD is thermally protected without requiring use of a separate thermal protector for each SPD. In one preferred embodiment, for example, three SPDs are employed to provide surge protection between the line-to-ground conductors, the line-to-neutral conductors, and the neutral-to-ground conductors, and each of the SPDs is thermally protected through the use of only two thermal protectors. Such an arrangement not only reduces manufacturing cost by eliminating one of the thermal protectors, but also improves reliability because the additive probability of failure of the additional thermal protector is likewise eliminated.

According to the invention, the aforesaid cost-effective, thermal protection benefit is achieved through a configuration in which at least one of the thermal protectors is electrically in series with and operably thermally coupled to two SPDs. In one preferred embodiment, for example, one SPD is electrically in series with and operably thermally coupled to two thermal protectors to provide redundant thermal protection to the SPD.

In another aspect of the present invention, each SPD is provided with overcurrent protection without requiring use of a separate overcurrent protector for each SPD. In one preferred embodiment, for example, in which three SPDs are employed to provide surge protection between three conductors of an AC power distribution system, each SPD is provided with overcurrent protection through the use of only two overcurrent protectors. Such an arrangement not only reduces manufacturing cost by eliminating one of the overcurrent protectors, but also improves reliability because the additive probability of failure of the additional overcurrent protector is likewise eliminated.

According to the invention, the aforesaid cost-effective, overcurrent protection benefit is achieved through a configuration in which at least one of the overcurrent protectors is electrically in series with two SPDs. In one preferred embodiment, for example, one SPD is electrically in series with two overcurrent protectors to provide redundant overcurrent protection to the SPD.

In yet another aspect of the present invention, the surge protection apparatus and method further provide for sensing continuity of a thermal protector, an overcurrent protector, or both, and generating a humanly-perceptible indication in the event that the thermal protector, overcurrent protector, or both lacks electrical continuity. In one preferred embodiment, for example, two continuity sensing circuits are employed, one to sense the electrical continuity of a first serially coupled thermal protector/overcurrent protector pair and the other to sense the electrical continuity of a second serially coupled thermal protector/overcurrent protector pair. In another preferred embodiment in which three SPDs are employed to provide surge protection between the line-to-ground conductors, the line-to-neutral conductors, and the neutral-to-ground conductors of an AC power distribution system, one continuity sensing circuit is arranged to sense a fault in the neutral-to-ground circuit path by simply monitoring the voltage across the SPD in the line-to-neutral circuit path, and another continuity sensing circuit is arranged to sense a fault in the neutral-to-ground circuit path by simply monitoring the voltage across the SPD in the line-to-ground circuit path. Thus, the arrangement of SPDs, thermal protectors, and overcurrent protectors in the present invention facilitates the simple detection of a fault in the neutral-to-ground circuit path, in sharp contrast to the difficulties incurred in detecting neutral-to-ground faults in prior art surge protectors.

In yet another aspect of the present invention, the surge protection apparatus and method further provide for sensing currents in the conductors of an AC power distribution system and generating a signal in response to the sensing of a surge current condition. In one preferred embodiment, the signal is processed by a counter to generate an indication of the number of surge current occurrences that have taken place over a period of time.

In yet another aspect of the present invention, a thermal protector for use in a surge protection apparatus comprises a member formed of an alloy which, during normal operation of the SPD that the alloy member protects, remains in an electrically conductive, solid phase mounted substantially free of any non-gravitational biasing force to form an electrically and mechanically continuous conductive path and which, upon reaching a temperature attainable in the event of overheating of the SPD, melts sufficiently to disintegrate adequately under its own weight to open the conductive path, and thereby abate overheating of the SPD. Such an arrangement of the thermal protector not only reduces manufacturing cost by using only an alloy member (as opposed to using both an alloy member, such as solder, and a mechanically biased member as in the prior art), but also provides for permanent opening of the circuit path upon melting of the alloy. In one preferred embodiment, the alloy member comprises a low temperature solder wire having a melting point of less than one hundred degrees Celsius (100° C.). In another embodiment, the low temperature solder wire preferably has a composition of tin, bismuth, cadmium, and lead.

These and other aspects and advantages of the invention will become more apparent to a person of ordinary skill in the art upon review of the following detailed description of a preferred embodiment taken in conjunction with the appended drawings in which like reference numerals designate like items.

DETAILED DESCRIPTION OF A PREFERRED EMBODIMENT

Generally, the present invention encompasses an apparatus and method for surge protecting an electrical load connected to an AC power distribution system. The apparatus is coupleable to at least three conductors of the AC power distribution system. A first circuit path of the apparatus electrically couples a first conductor of the AC power distribution system to a second conductor of the AC power distribution system. The first circuit path includes a first thermal protector electrically in series with and operably thermally coupled to a first surge protection device. A second circuit path of the apparatus electrically couples the first conductor of the AC power distribution system to a third conductor of the AC power distribution system. The second circuit path includes a second thermal protector electrically in series with and operably thermally coupled to a second surge protection device. A third circuit path of the apparatus electrically couples the second conductor of the AC power distribution system to the third conductor of the AC power distribution system. The third circuit path includes a third surge protection device electrically in series with and operably thermally coupled to at least one of the first thermal protector and the second thermal protector. The electrical load may be connected between any two or more of the conductors. By surge protecting an electrical load in this manner, the present invention facilitates redundant thermal protection for the surge protection device of the third circuit path (typically coupling the neutral conductor to the ground conductor), permits simple detection of faults in the third circuit path, and utilizes fewer thermal protection elements than existing surge protectors, while providing at least an equivalent level of thermal protection to the surge protection devices.

Figure 1:
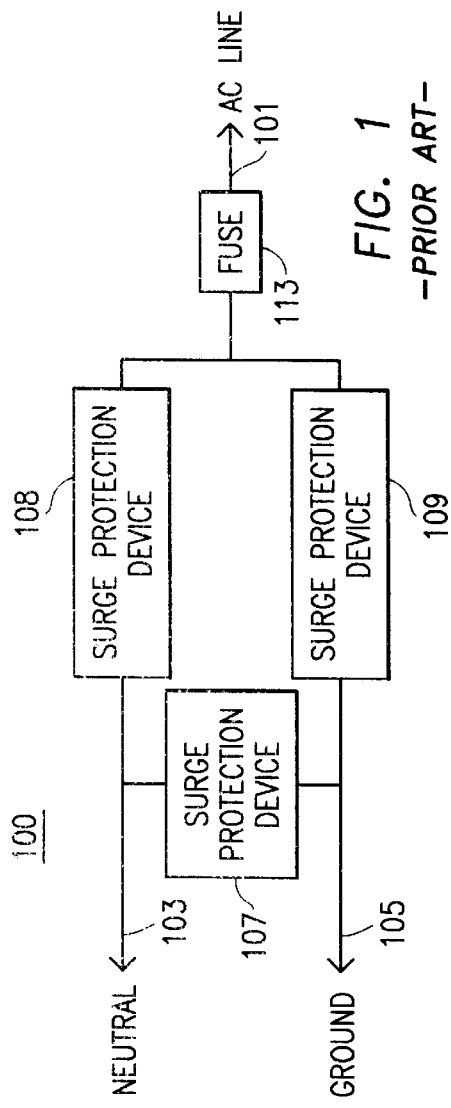
FIG. 1 is a block diagram of a typical prior art electrical surge protector for use in an AC power distribution system.
Figure 2:
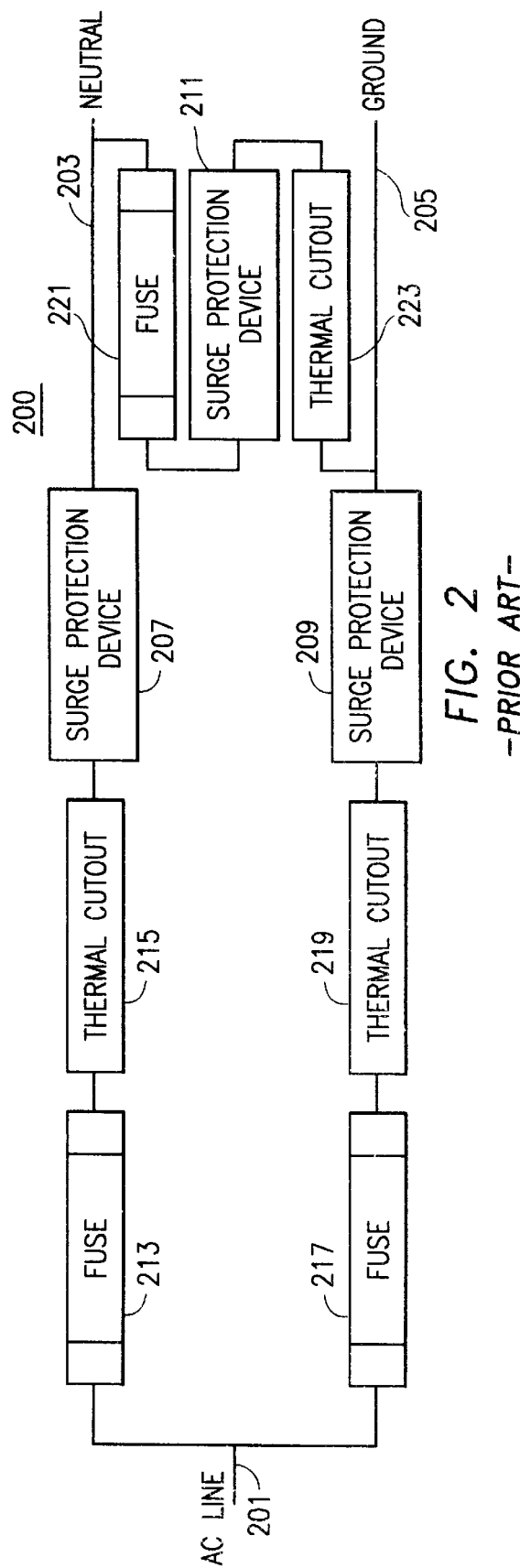
FIG. 2 is block diagram of another typical prior art electrical surge protector for use in an AC power distribution system.
Figure 3:
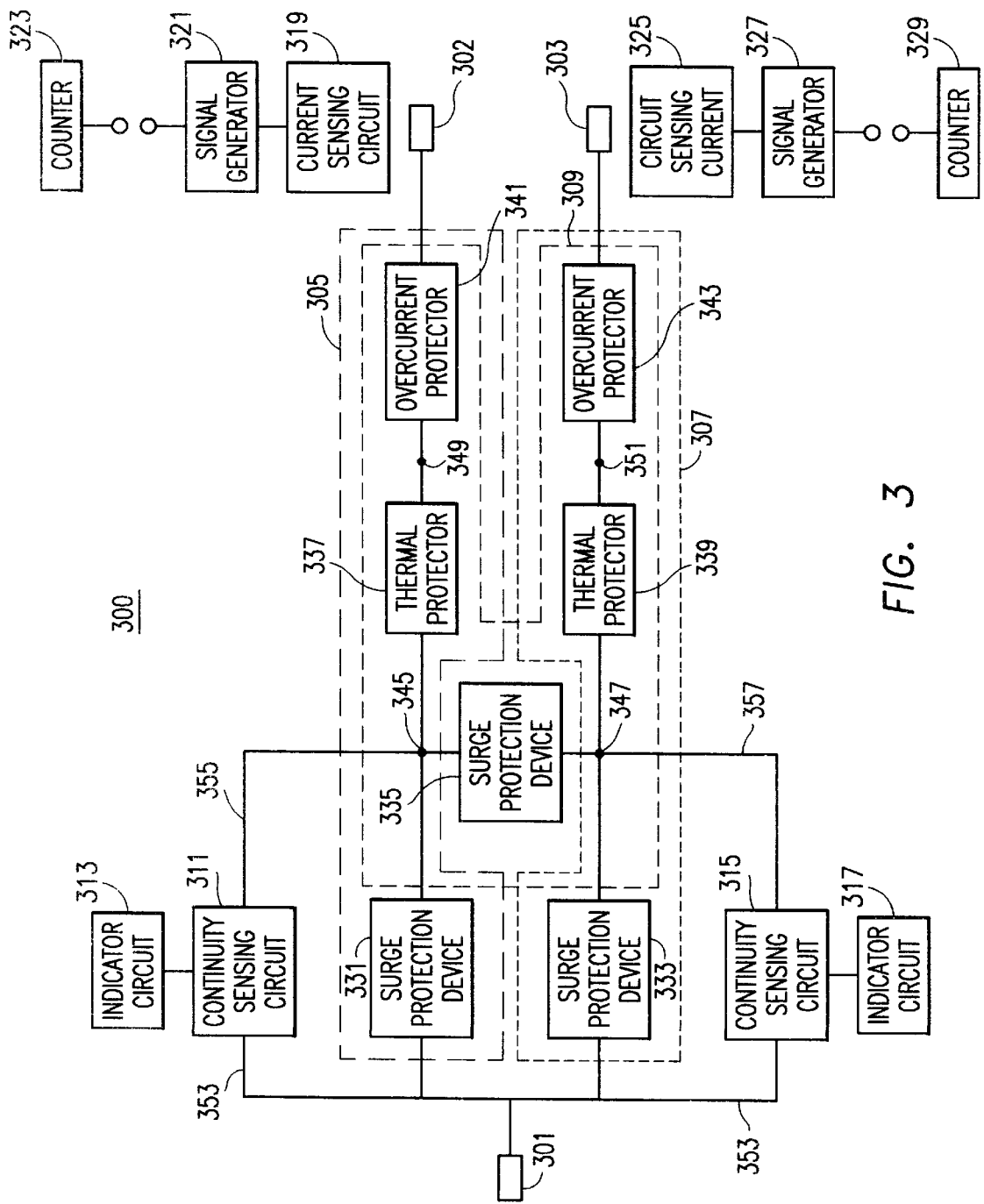
FIG. 3 is a block diagram of an electrical surge protection apparatus in accordance with a preferred embodiment of the present invention.

The present invention can be more fully understood with reference to FIGS. 3–9. FIG. 3 is a block diagram of an electrical surge protection apparatus 300 in accordance with a preferred embodiment of the present invention. The preferred surge protection apparatus 300 includes three conductor contacts 301–303, an electrical surge protection portion, an electrical continuity sensing portion, and a current sensing portion. The surge protection portion includes three circuit paths 305 307, 309. A first circuit path 305 is connected between conductor contacts 301 and 302, and, when conductor contacts 301, 302 are connected to respective conductors of an AC power distribution system, electrically couples a first conductor of the AC power distribution system to a second conductor of the AC power distribution system. A second circuit path 307 is connected between conductor contacts 301 and 303, and, when conductor contacts 301, 303 are connected to respective conductors of the AC power distribution system, electrically couples the first conductor of the AC power distribution system to a third conductor of the AC power distribution system. A third circuit path 309 is connected between conductor contacts 302 and 303, and, when conductor contacts 302, 303 are connected to respective conductors of the AC power distribution system, electrically couples the second conductor of the AC power distribution system to the third conductor of the AC power distribution system.

Each circuit path 305, 307, 309 preferably includes a surge protection device (SPD) 331, 333, 335 electrically in series with at least one thermal protector 337, 339 and at least one overcurrent protector 341, 343. For example, as shown in FIG. 3, circuit path 305 includes SPD 331 in series with thermal protector 337 and overcurrent protector 341. Similarly, circuit path 307 includes SPD 333 in series with thermal protector 339 and overcurrent protector 343. By contrast, circuit path 309 includes SPD 335 in series with both thermal protectors 337, 339 and both overcurrent protectors 341, 343. Thus, circuit paths 305 and 309 have a common path segment that preferably includes thermal protector 337 and overcurrent protector 341. Similarly, circuit paths 307 and 309 have a common path segment that preferably includes thermal protector 339 and overcurrent protector 343.

In addition to being electrically in series with SPD 331 and overcurrent protector 341 in circuit path 305 and being electrically in series with SPD 335 in circuit path 309, thermal protector 337 is operably thermally coupled to both SPD 331 and SPD 335. In the preferred embodiment, such thermal coupling is obtained by soldering thermal protector 337 to the same solder pad 345 to which a terminal of each SPD 331, 335 is soldered. In an alternative embodiment, such thermal coupling may be obtained by bonding the thermal protector 337 to solder pad 345 through use of an electrically and thermally conductive epoxy, such as the "ECCOBOND" 56C conductive epoxy that is commercially available from Emerson & Cuming Specialty Polymers of Billerica, Massachusetts. By thermally coupling thermal protector 337 to both SPD 331 and SPD 335 in such a manner, one thermal protector (i.e., thermal protector 337) provides thermal protection to two SPDs 331, 335 in the event that the temperature of either one of the SPDs 331, 335 rises to an undesired level (e.g., the melting temperature of the solder). By contrast, prior art surge protectors that incorporate thermal protection of SPDs utilize one thermal protector per SPD (i.e., two thermal protectors to thermally protect two SPDs). Therefore, the present invention provides a surge protection circuit topology that reduces the number of thermal protectors necessary to thermally protect the SPDs.

In a manner preferably identical to the thermal coupling of thermal protector 337 to SPDs 331 and 335, thermal protector 339 is operably thermally coupled to SPDs 333 and 335. That is, in the preferred embodiment, one end of thermal protector 337 is soldered to the same solder pad 347 to which a terminal of each SPD 333, 335 is soldered. Thus, in the preferred embodiment, SPD 335 is thermally protected by both thermal protector 337 and thermal protector 339, thereby resulting in redundant thermal protection for SPD 335. In an analogous manner, SPD 335 is provided with redundant overcurrent protection in the preferred embodiment by being electrically in series with both overcurrent protector 341 and overcurrent protector 343. In alternative embodiments in which redundant thermal protection of SPD 335 and/or redundant overcurrent protection is not desired, SPD 335 may be connected between solder pad 345 and node 351, between solder pad 347 and node 349, between solder pad 345 and conductor contact 303, or between solder pad 347 and conductor contact 302 (the latter two possibilities where no redundant overcurrent protection is desired).

As discussed above each SPD 331, 333, 335 may comprise any device which, in normal operation, exhibits a relatively high electrical impedance, but which, upon being subjected to a voltage of sufficiently high magnitude, exhibits a significantly lower impedance and conducts electrical current relatively readily. Examples of such devices include, but are not limited to, varistors, silicon avalanche diodes, zener diodes, selenium cells, gas discharge tubes, and high voltage capacitors. In the preferred embodiment, each SPD 331, 333, 335 comprises one or more metal oxide varistors (MOVs). In particular, SPD 331 and SPD 333 preferably comprise three MOVs electrically in parallel with one another; whereas, SPD 335 preferably comprises one MOV.

Each thermal protector 337, 339 may comprise any device or element which, in normal operation, exhibits a relatively low electrical impedance, but which, upon being subjected to temperatures above a temperature threshold, exhibits a significantly higher impedance and substantially prevents the flow of electrical current. Examples of such devices or elements include, but are not limited to, solder wires, thermal fuses, thermal cutouts, thermal cutoffs, and bimetal thermostats. In the preferred embodiment, each thermal protector 337, 339 comprises an inverted U-shaped member (see reference numerals 411 and 415 in FIG. 7) formed of an electrically conductive alloy which, during normal operation of the SPD (e.g., 331) or SPDs (e.g., 331 and 335) to which the thermal protector (e.g., 337) is thermally coupled, remains in an electrically conductive, solid phase mounted (e.g. soldered) substantially free of any non-gravitational biasing force to form an electrically and mechanically continuous path between the SPD 331 and whatever element or device follows electrically in series with the thermal protector 337. In the preferred embodiment, thermal protector 337 forms an electrically and mechanically continuous path between SPD 331 and overcurrent protector 341. Likewise, thermal protector 339 preferably forms an electrically and mechanically continuous path between SPD 333 and overcurrent protector 343.

Similar to prior art thermal protectors, such as those described in U.S. Pat. Nos. 5,621,602 and 5,790,359, the preferred thermal protector 337 of the present invention is soldered to the same solder pad 345 as the SPD 331 or SPDs 331, 335 that it protects. However, in contrast to such prior art thermal protectors, the preferred thermal protector 337 does not have any non-gravitational bias applied to it other than the bias normally imposed by positioning an element on a solder pad and soldering the element to the pad. Thus, when the temperature of the preferred thermal protector 337 reaches a temperature attainable in the event of overheating of an SPD (e.g., 331) that it protects, the preferred thermal protector 337 simply melts and disintegrates under its own weight to open the circuit path (e.g., 305) of which it's a part, thereby abating the overheating of the SPD 331. By contrast, prior art thermal protectors require a mechanically biased member to form part of the thermal protector, such that when the solder attaching the mechanically biased member to the SPD melts, the mechanically biased member respectively recoils or unflexes to open the circuit path. With the preferred thermal protector 337, no such mechanically biased members are necessary, resulting in a lower cost, less complex thermal protector. However, it should be noted that, although the above discussion illustrates the benefits of using only an alloy member to implement the thermal protectors 337, 339, the arrangement of the elements of the preferred surge protection apparatus 300 has many benefits of its own as described herein, regardless of which implementation or implementations are used for the thermal protectors 337, 339.

The alloy used to form the inverted U-shaped member 411, 415 preferably comprises tin, bismuth, cadmium, and lead, although any other electrically conductive alloy composite with a melting temperature of less than about one hundred degrees Celsius (100° C.) may be used. The alloy is preferably made up of from 1–15 weight percent tin, 40–60 weight percent bismuth, 1–15 weight percent cadmium, and 20–45 weight percent lead. In a preferred embodiment, the alloy used to form the inverted U-shaped member 411, 415 preferably comprises about 12.5 weight percent tin, about 50 weight percent bismuth, about 12.5 weight percent cadmium, and about 25 weight percent lead to produce a low temperature solder wire with a melting temperature of about eighty degrees Celsius (80° C.). In an alternative embodiment, the solderability of the inverted U-shaped member 411, 415 to the solder pad (e.g., solder pad 345) may be improved by altering the composition of the alloy. In particular, the alloy used to form the inverted U-shaped member 411, 415 may comprise about 9.3 weight percent tin, about 50 weight percent bismuth, about 6.2 weight percent cadmium, and about 34.5 weight percent lead to produce the low temperature solder wire with a melting temperature of less than about one hundred degrees Celsius (100° C.). Notwithstanding the particular compositions of the alloy thermal protector discussed above, other alloy compositions, such as those that include tin, lead, bismuth, cadmium, and indium, will become apparent to those having ordinary skill in the art depending on the desired melting temperature of the solder wire. All such compositions are intended to fall within the spirit and scope of the present invention.

Each overcurrent protector 341, 343 may comprise any device or element which, in normal operation, exhibits a relatively low electrical impedance, but which, upon being subjected to an electrical current above a current threshold, exhibits a significantly higher impedance and substantially prevents the flow of electrical current. Examples of such devices or elements include, but are not limited to, fuses, small gauge wires acting as fuses, or printed circuit board traces acting as fuses. In the preferred embodiment, each overcurrent protector 341, 343 comprises a fuse of an appropriate voltage and current rating to adequately protect the SPDs 331, 333, 335 used in the surge protection apparatus 300.

As briefly mentioned above, in addition to including a surge protection portion, the preferred surge protection apparatus 300 also includes a continuity sensing portion and a current sensing portion. The continuity sensing portion includes at least one continuity sensing circuit 311, 315 and at least one indicator circuit 313, 317. In the preferred embodiment, as shown, the continuity sensing portion includes a first continuity sensing circuit 311 coupled to a first indicator circuit 313 and a second continuity sensing circuit 315 coupled to a second indicator circuit 317. The continuity sensing portion of the preferred surge protection apparatus 300 is included for diagnostic purposes only and, as such, its inclusion in the preferred surge protection apparatus 300 is preferential, not essential.

In the event that continuity sensing circuits 311, 315 are included, each continuity sensing circuit 311, 315 is disposed in a continuity sensing relation to its respective circuit path 305, 307 and includes appropriate circuitry to sense the continuity of its respective circuit path 305, 307. In the preferred embodiment, continuity sensing circuit 311 is connected electrically in parallel with SPD 331 and continuity sensing circuit 315 is connected electrically in parallel with SPD 333. In such positions, the continuity sensing circuits 311, 315 can detect an open circuit condition (i.e., lack of continuity) or a short circuit condition in the circuit path 305, 307 each continuity circuit 311, 315 is respectively sensing.

It should be noted that due to the arrangement of the SPDs 331, 333, 335, thermal protectors 337, 339, and overcurrent protectors 341, 343 in the preferred surge protection apparatus 300, each continuity sensing circuit 311, 315 not only senses the continuity of the circuit path 305, 307 containing the SPD 331, 335 that the continuity sensing circuit 311, 315 is in parallel with, but also senses the continuity of a path segment of the remaining circuit path 309 because, as discussed above, the thermal protectors 337, 339 and the overcurrent protectors 341, 343 preferably form segments of multiple circuit paths. Therefore, in the event that circuit path 309 couples the AC power distribution system's neutral conductor to its ground conductor, the present invention provides a circuit topology by which one or both continuity sensing circuits 311, 315 can sense a fault (e.g., an open circuit condition) in the circuitry providing surge protection between the neutral and ground conductors. Such a fault in the circuitry providing surge protection between the neutral and ground conductors is very difficult to detect in existing surge protection apparatuses because the instantaneous voltage between neutral and ground may, in the normal course of operation, be zero volts. Thus, simply placing a voltmeter across the neutral and ground conductors 203, 205 of the surge protector 200, or for that matter across the SPD 211 protecting the neutral-to-ground path, is not sufficient to detect an open circuit in either the thermal protector 223 or the overcurrent protector 221 in the neutral-to-ground path.

Each continuity sensing circuit 311, 315 draws a relatively small amount of current during normal operation of the preferred surge protection apparatus 300. Thus, when either the thermal protector 337, 339 or the overcurrent protector 341, 343 fails in an open circuit condition, no voltage is present across the respective SPD 331, 333 and, accordingly, current stops flowing in the respective continuity sensing circuit 311, 315. The preferred composition of each continuity sensing circuit 311, 315 is described in detail below with respect to FIG. 5.

Each indicator circuit 313, 317 is coupled to its respective continuity sensing circuit 311, 315 and generates a humanly-perceptible indication in the event that the respective continuity sensing circuit 311, 315 senses a predetermined condition, such as an open circuit, related to electrical continuity of the circuit path being sensed by the respective continuity sensing circuit 311, 315. That is, in the preferred embodiment, indicator circuit 313 generates a humanly-perceptible indication in the event that continuity sensing circuit 311 senses an open circuit condition in either thermal protector 337 or overcurrent protector 341. Similarly, indicator circuit 317 generates a humanly-perceptible indication in the event that continuity sensing circuit 315 senses an open circuit condition in either thermal protector 339 or overcurrent protector 343. In the preferred embodiment, each indicator circuit 313, 317 includes a light emitting diode (LED) that illuminates to permit the AC power distribution user or service personnel to perceive locally (i.e., at the location of the surge protection apparatus 300) that an undesirable continuity condition exists. However, in alternative embodiments, various other humanly-perceptible indications may be utilized to locally or remotely alert the AC distribution system user or service personnel of the undesirable continuity condition. Such other indications include, but are not limited to, audible alerts, visual alerts (e.g., lights, text, meters, or mechanical flags), or combinations of audible and visual alerts. In addition, although the preferred embodiment of the present invention utilizes two LEDs to permit service personnel to quickly determine which thermal protector/overcurrent protector path segment may be at fault, an alternative embodiment in which only a course indication is desired might utilize only a single LED that illuminates when either continuity sensing circuit 311, 315 senses an open circuit condition. The preferred composition of each indicator circuit 313, 317 is also described in detail below with respect to FIG. 5.

The current sensing portion includes at least one current sensing circuit 319, 325 and at least one signal generator circuit 321, 327. In the preferred embodiment, as shown, the current sensing portion includes a first current sensing circuit 319 coupled to a first signal generator circuit 321 and a second current sensing circuit 325 coupled to a second signal generator circuit 327. The current sensing portion of the preferred surge protection apparatus 300 is included for diagnostic purposes only and, as such, its inclusion in the preferred surge protection apparatus 300 is preferential, not essential.

In the event that current sensing circuits 319, 325 are included in the electrical surge protection apparatus 300, each current sensing circuit 319, 325 is disposed in a current sensing relation to a conductor of the AC power distribution system and includes appropriate circuitry to sense surge currents in the conductor. In the preferred embodiment, current sensing circuit 319 comprises an inductor positioned in proximity to conductor contact 302 and current sensing circuit 325 comprises an inductor positioned in proximity to conductor contact 303. By positioning the inductors proximate to their respective conductor contacts 302, 303, each inductor can detect changes in current flow through its respective conductor contact 302, 303 (and therefore through the conductor connected to the contact) because such changes in current flow create a magnetic field in accordance with known electromagnetic field theory that induces a voltage across the respective inductor. The induced voltage is then utilized by the signal generator circuit 321, 327 to generate a signal (e.g., a voltage pulse) indicative of a surge current condition.

The signal is preferably conveyed to a remote counter 323, 329 that is coupleable to the signal generator circuit 321, 327 (e.g., via a wireline, ribbon cable, or fiber optic cable). The counter 323, 329 processes the signal to generate an indication of the number of current surges that have occurred over a period of time. Although two counters 323, 329 are depicted in FIG. 3 (one coupleable to each signal generator circuit 321, 327), one of ordinary skill in the art will recognize that a single remote counter may be used to count the total number of surge current occurrences sensed by the surge protection apparatus 300 as a whole, instead of separately counting the number of surge current occurrences sensed at each conductor contact 302, 303. That is, both signal generators 321, 327 may provide their signals to a single counter. The preferred composition of each current sensing circuit 319, 325 and each signal generator circuit 321, 327 is described below with respect to FIG. 6.

Operation of the preferred surge protection apparatus 300 occurs substantially as follows in accordance with the present invention. Upon connecting the conductor contacts 301–303 to respective conductors of the AC power distribution system, the surge protection apparatus 300 functions in a manner similar to existing surge protection devices. That is, when a high voltage power surge occurs between any two conductors (e.g., due to a lightning strike), the SPD 331, 333, 335 coupled between those conductors exhibits a low impedance as compared to the impedance of the electrical load (not shown—e.g., electronic or electric devices or simply electrical wiring) coupled between the two conductors (e.g., an impedance of less than one-tenth the impedance of the load). The low impedance presented by the SPD 331, 333, 335 at high voltages causes the surge current induced by the power surge to flow through the SPD 331, 333, 335 instead of through the electrical load, thereby preventing damage to the load due to the power surge.

In the preferred embodiment, conductor contact 301 is connected to the line conductor of the AC power distribution system, conductor contact 302 is connected to the neutral conductor, and conductor contact 303 is connected to the ground conductor. However, application of the present invention is not limited to such connections. Rather, due to the symmetry of the preferred surge protection apparatus 300, any conductor of the AC power distribution system can be connected to any conductor contact 301–303. For example, conductor contact 301 can be connected to the ground conductor when conductor contact 302 is connected to the neutral conductor and conductor contact 303 is connected to the line conductor. As another example, conductor contact 301 can be connected to the neutral conductor when conductor contact 302 is connected to the line conductor and conductor contact 303 is connected to the ground conductor.

In the event that one or more of the SPDs 331, 333, 335 reaches the end of its useful life and fails to perform in accordance with the manufacturer's listed specifications, heating of the failed or failing SPD (e.g., 331) or excessive path current during a current surge may result. If SPD heating occurs without excessive path current, the respective thermal protector 337 opens, thereby protecting the SPD 331 from overheating. If excessive path current occurs, the respective overcurrent protector 341 opens, thereby protecting the electrical load and the SPD 331 from further damage due to excessive current. The diagnostic circuits then alert service personnel, through local and/or remote alarms, of the continuity failure and/or surge current condition.

Although discussed above with respect to a preferred surge protection apparatus 300 that includes both a thermal protector 337, 339 and an overcurrent protector 341, 343 in each of circuit paths 305 and 307, the present invention is also applicable in the event that either only the thermal protectors 337, 339 or only the overcurrent protectors 341, 343 are used. When only the thermal protectors 337, 339 are used (i.e., when circuit path 305 includes only SPD 331 and thermal protector 337 and circuit path 307 includes only SPD 333 and thermal protector 339), no overcurrent protection exists and SPD 335 need be thermally coupled to thermal protector 337, thermal protector 339, or both. Thus, as in the preferred embodiment, three SPD circuit paths 305, 307, 309 are thermally protected using only two thermal protectors 337, 339. Thermally coupling SPD 335 to both thermal protector 337 and thermal protector 339 results in redundant thermal protection in circuit path 309. When only the overcurrent protectors 341, 343 are used (i.e., when circuit path 305 includes only SPD 331 and overcurrent protector 341 and circuit path 307 includes only SPD 333 and overcurrent protector 343), no thermal protection exists and coupling SPD 335 to both overcurrent protectors 341, 343 results in redundant overcurrent protection in circuit path 309.

As described above, the present invention provides a circuit topology for providing surge protection in AC power distribution systems. In contrast to prior art surge protection techniques that require one thermal protection device per SPD, the present invention utilizes only two thermal protection devices to not only thermally protect three SPDs, but also, in the preferred embodiment, to provide redundant thermal protection to one of the three SPDs. In addition, the circuit topology of the present invention facilitates simple detection of an open-circuit condition in the neutral-to-ground circuit path of the surge protection apparatus, a condition that is currently very difficult to detect in existing surge protection apparatuses.

As additionally described above, the present invention further provides a thermal protector for use in surge protector circuits. In contrast to prior art thermal protectors that require both a mechanically biased element and a solder alloy, the thermal protector of the present invention uses only an alloy, thereby providing a more economical and reliable thermal protector than its prior art counterparts.

Figure 4:
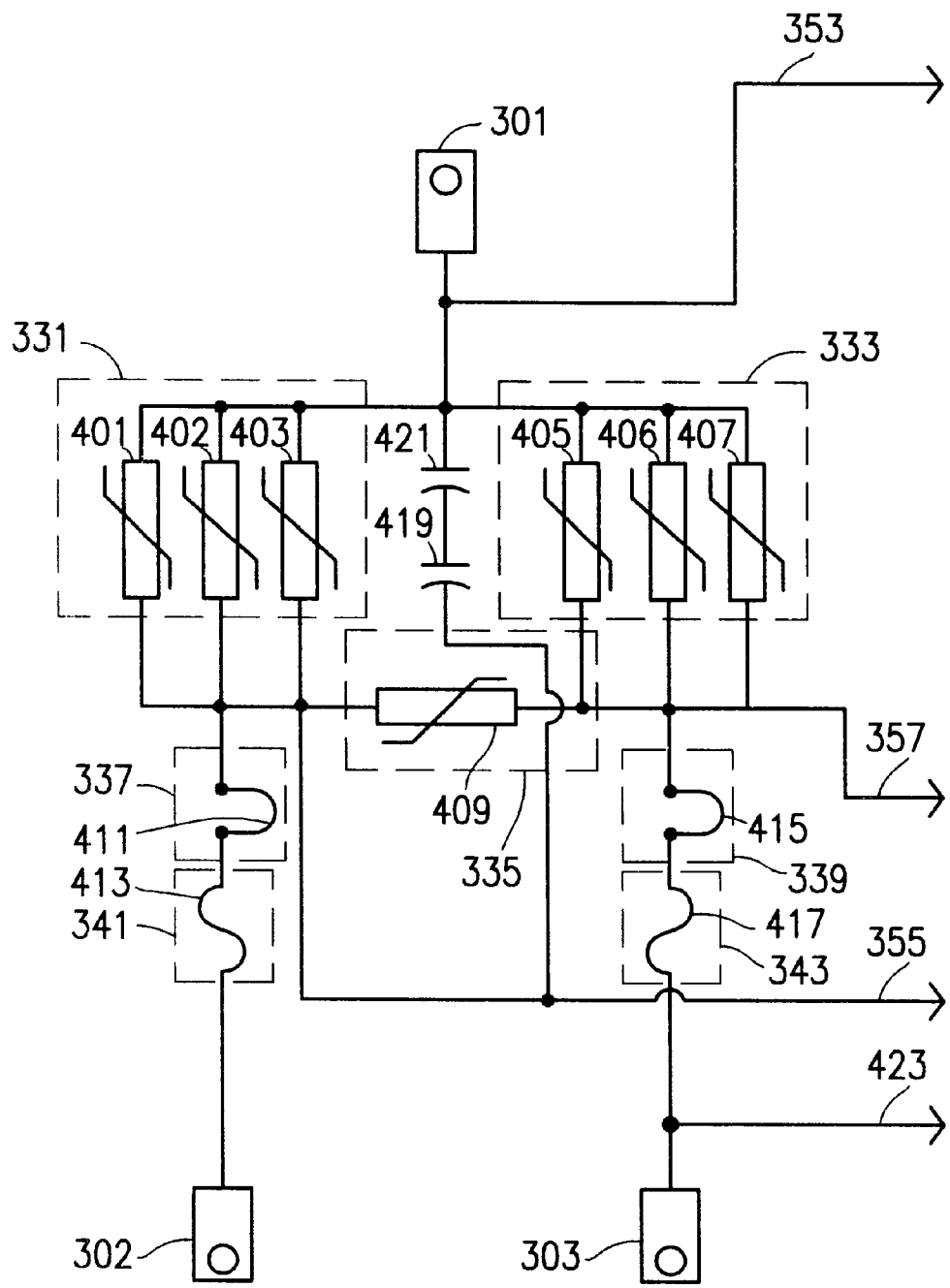
FIG. 4 is a schematic and block diagram of an electrical surge protection portion of the preferred electrical surge protection apparatus of FIG. 3.

FIG. 4 is a schematic and block diagram of the electrical surge protection portion 400 of the preferred electrical surge protection apparatus 300 of FIG. 3. The electrical surge protection portion 400 includes the SPDs 331, 333, 335, the thermal protectors 337, 339, and the overcurrent protectors 341, 343. The preferred electrical surge protection portion 400 also includes wires and/or printed circuit board traces 353, 355, 357, 423 to facilitate coupling of the continuity sensing circuits 311, 315 to respective parts of the electrical surge protection portion 400 and to provide a ground return 423 for a power supply (illustrated in FIG. 5) used in conjunction with the continuity sensing 311, 315 and indicator 313, 317 circuits. The preferred electrical surge protection portion 400 further includes two capacitors 419, 421 that provide high frequency filtering and noise reduction.

As shown in FIG. 4 and briefly mentioned above, SPD 331 preferably comprises three MOVs 401–403 electrically in parallel with one another. Likewise, SPD 333 preferably comprises three MOVs 405–407 electrically in parallel with one another. The number of parallel-connected MOVs used to implement SPDs 331 and 333 depends on the maximum expected surge current. For example, three parallel-connected MOVs may be used at a building's electrical service entrance due to the high likelihood that a lightning-induced surge current will enter the building at the electrical service entrance. Fewer parallel-connected MOVs may be used in "downstream" applications (e.g., inside the building) where expected peak surge currents are lower than at the electrical service entrance.

SPD 335 preferably comprises one MOV 409 due to the typically low peak voltage and/or surge current differential between neutral and ground, and each thermal protector 337, 339 preferably comprises an inverted-U shaped solder alloy member 411, 415, as described above with respect to FIG. 3. Each overcurrent protector 341, 343 preferably comprises a fuse 413, 417 and each conductor contact 301–303 preferably comprises a seventeen (17) millimeter by nineteen (19) millimeter rectangular piece of tin-plated or nickel-plated copper having a hole to facilitate attachment (e.g., though use of a threaded screw and a nut) of the conductor contact 301–303 to a corresponding conductor of the AC power distribution system.

Table 1 below is a parts listing for the preferred surge protection portion 400 of FIG. 4 for use in an AC power distribution system having a maximum AC voltage of six hundred (600) volts.

TABLE 1

| Reference Numeral(s) | Description | Quantity | Manufacturer | Manufacturer's Part Number |
|---|---|---|---|---|
| 401–403, 405–407, 409 | 120 V AC Metal Oxide Varistor | 7 | Harris Corp. (Melbourne, FL). | V151HA40 |
| 411, 415 | 3.175 mm diameter solder alloy cut and formed into U shape | 2 | Belmont Metals, Inc. (Brooklyn, NY). | Alloy #2502 |
| 413, 417 | 600 V AC, 200KA Fuse | 2 | Gould Electronics, Inc. (Newbury Port, MA). | APT 100 |
| 419, 421 | 0.22 µF capacitor (275 V AC) | 2 | World Products, Inc. (Sonoma, CA). | WXE-224K |

Figure 5:
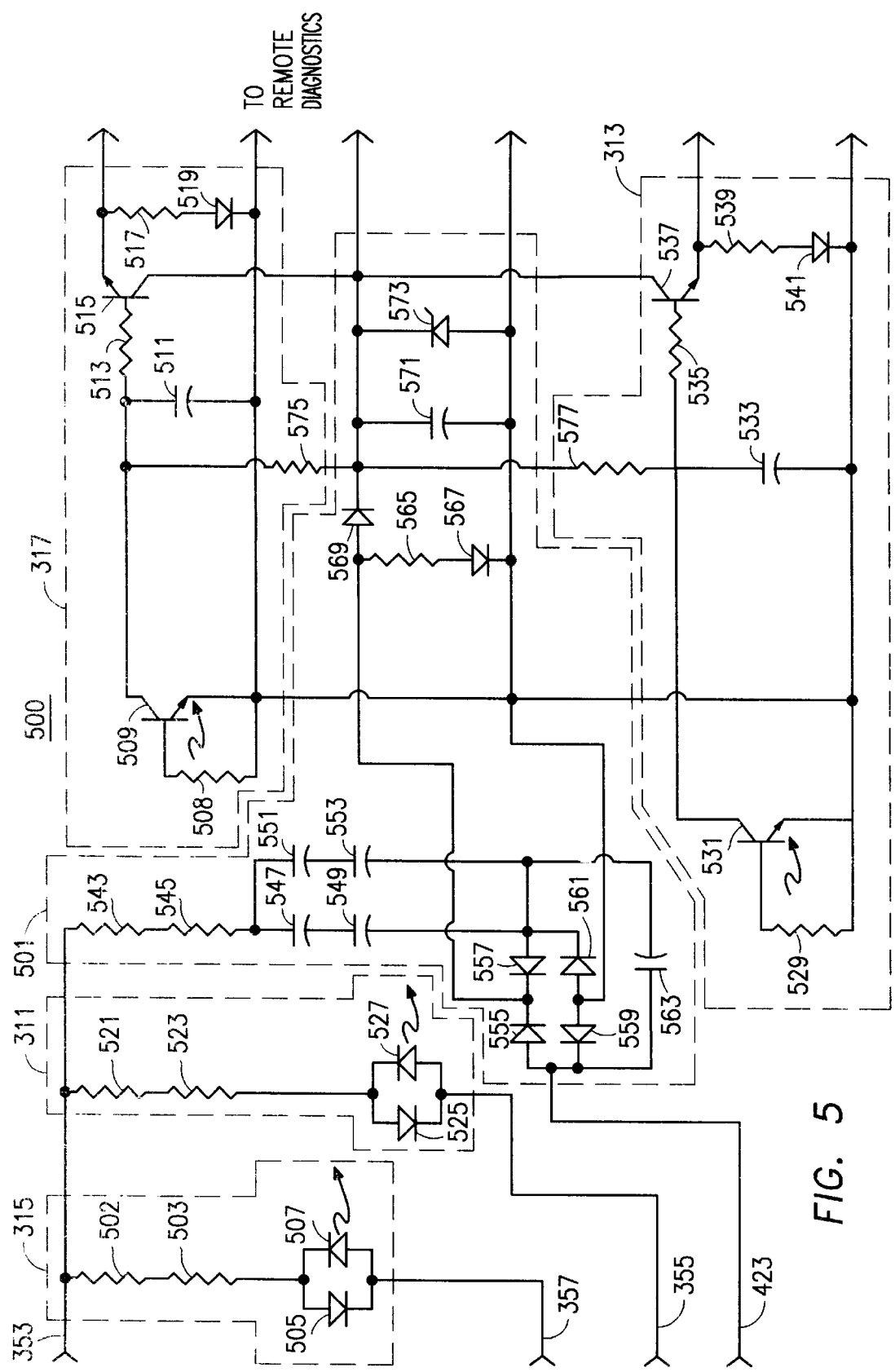
FIG. 5 is a schematic and block diagram of an electrical continuity sensing portion of the preferred electrical surge protection apparatus of FIG. 3.

FIG. 5 is a schematic and block diagram of an electrical continuity sensing portion 500 of the preferred electrical surge protection apparatus 300 of FIG. 3. The electrical continuity sensing portion 500 includes the continuity sensing circuits 311, 315 and the indicator circuits 313, 317. FIG. 5 also depicts a schematic diagram for a preferred power supply circuit 501 for providing direct current (DC) power to the continuity sensing portion 500. In addition to the continuity sensing circuits 311, 315 and the indicator circuits 313, 317, the preferred continuity sensing portion 500 also includes wires and/or printed circuit board traces 353, 355, 357, 423 to facilitate coupling of the continuity sensing circuits 311, 315 to respective parts of the electrical surge protection portion 400, to provide a ground return 423 for the power supply 501, and to facilitate connection of the continuity sensing portion 500 to remote diagnostic circuitry (not shown).

As shown in FIG. 5, continuity sensing circuit 315 preferably includes two series resistors 502, 503 and two diodes 505, 507. The two diodes 505, 507 preferably form an optical transmission portion of a first optical isolator. The optical reception portion of the first optical isolator preferably comprises a transistor 509 that forms part of indicator circuit 317. Indicator circuit 317 also preferably includes four resistors 508, 513, 517, 575, a capacitor 511, another transistor 515, and a diode 519.

In a similar manner, continuity sensing circuit 311 preferably includes two series resistors 521, 523 and two diodes 525, 527. The two diodes 525, 527 preferably form an optical transmission portion of a second optical isolator. The optical reception portion of the second optical isolator preferably comprises a transistor 531 that forms part of indicator circuit 313. Indicator circuit 313 also preferably includes four resistors 529, 535, 539, 577, a capacitor 533, another transistor 537, and a diode 541.

During normal operation of the electrical surge protection apparatus 300, thermal protector 337 and overcurrent protector 341 are effectively short circuits and a voltage exists across SPD 331. Similarly, thermal protector 339 and overcurrent protector 343 are effectively short circuits and a voltage exists across SPD 333. Current flows through resistors 502, 503, 521 and 523, and through the diodes 505, 507, 525, 527 forming the optical transmission portions of the optical isolators. The current flow through the optical transmission portions of the optical isolators causes the optical transmission portions to convey light toward the respective optical reception portions. The conveyed light causes the transistors 509, 531 forming the optical reception portions to conduct and the voltage across loading capacitors 511 and 533 to be low (about 0.3 volts). The low voltage across capacitors 511 and 533 prevent transistors 515 and 537, respectively, from turning on. Consequently, no current flows through LEDs 519 and 541, indicating no fault exists.

When either thermal protector 337 or overcurrent protector 341 becomes open-circuited, the voltage across SPD 331 is zero volts. As a consequence, the current through the optical transmission portion of the first optical isolator goes to zero and transistor 531 turns off. When transistor 531 turns off, transistor 537 turns on and current flows through LED 541 to provide a visible indication of a fault in either thermal protector 337 or overcurrent protector 341. In addition (or in the alternative if no local fault indication is provided), if remote diagnostics are utilized, the voltage appearing at the emitter of transistor 537 is provided to the remote diagnostic station to indicate a fault in the path segment of circuit paths 305 and 309 that includes thermal protector 337 and overcurrent protector 341.

When either thermal protector 339 or overcurrent protector 343 becomes open-circuited, the voltage across SPD 333 is zero volts. As a consequence, the current through the optical transmission portion of the second optical isolator goes to zero and transistor 509 turns off. When transistor 509 turns off, transistor 515 turns on and current flows through LED 519 to provide a visible indication of a fault in either thermal protector 339 or overcurrent protector 343. In addition (or in the alternative if no local fault indication is provided), if remote diagnostics are utilized, the voltage appearing at the emitter of transistor 515 is provided to the remote diagnostic station to indicate a fault in the path segment of circuit paths 307 and 309 that includes thermal protector 339 and overcurrent protector 343.

The power supply circuit 501 includes resistors 543, 545 and capacitors 547, 549, 551, 553 in series with a full wave bridge consisting of diodes 555, 557, 559, and 561. One side of the full wave bridge is connected to ground via wire 423 to ensure that low voltage diagnostic signals are at a low electric potential with respect to ground. Capacitor 571 filters the DC output of the full wave bridge, while zener diode 573 regulates the DC output. Capacitors 547, 549, 551, and 553 limit the power supply current at low frequencies (typically 50 and 60 Hertz power line frequencies). Resistors 543 and 545 limit the power supply current at all frequencies. A local indication that electrical power is being applied to the electrical surge protection apparatus 300 is provided by LED 567. In the preferred embodiment, voltage is present from the AC line (conductor contact 301) to ground (conductor contact 303) when LED 567 is on.

Table 2 below is a parts listing for the preferred continuity sensing portion 500 of FIG. 5, including a parts listing for the power supply 501.

TABLE 2

| Reference Numeral(s) | Description | Quantity | Manufacturer | Manufacturer's Part Number |
|---|---|---|---|---|
| 501, 502, 521, 523, 543, 545 | 15 kΩ resistor, 2 watt | 6 | Panasonic Industrial Co. (Div. Of Matsushita Electric Corp. of America) (Secaucus, NJ) | ERG-2SJ153 |
| 505, 507, 509 and 525, 527, 531 | Optocoupler | 2 | QT Optoelectronics (Sunnyvale, CA) | H11AA4 |
| 508, 529 | 100 kΩ resistor, ¼ watt | 2 | Xicon Passive Components (Arlington, TX) | 291-100K |
| 513, 535, 575, 577 | 330 kΩ resistor, ¼ watt | 4 | Xicon Passive Components (Arlington, TX) | 291-300K |
| 517, 539 | 1.0 kΩ resistor, ¼ watt | 2 | Xicon Passive Components (Arlington, TX) | 291-1K/AP |
| 565 | 2.2 kΩ resistor, ¼ watt | 1 | Xicon Passive Components (Arlington, TX) | 291-2.2K/AP |
| 511, 533, 563 | 0.1 μF capacitor, 250 V | 3 | Xicon Passive Components (Arlington, TX) | MF250V.1K |
| 547, 549 | 0.1 μF capacitor, 250 V | 2 | Xicon Passive Components (Arlington, TX) | MF250V.1K |
| 551, 553 | 2.7 μF capacitor, 250 V | 2 | Panasonic Industrial Co. (Div. Of Matsushita Electric Corp. of America) (Secaucus, NJ) | ECQE2275KF |
| 571 | 470 μF capacitor, 10 V | 1 | Xicon Passive Components (Arlington, TX) | XRL10V470 |
| 555, 557, 559, 561 | Bridge Rectifier, 1000 V | 1 | Taitron Components, Inc. (Santa Clarita, CA) | DF10M |
| 515, 537 | TO-92 Darlington Transistor | 1 | Zetek (Commack, NY) | ZTX 601B |
| 519, 541 | Light emitting diode, red | 2 | Hewlett Packard Co. (Palo Alto, CA) | HLMP-1700 |
| 567 | Light emitting diode, green | 1 | Hewlett Packard Co. (Palo Alto, CA) | HLMP-1790 |
| 569 | Rectifier diode | 1 | Motorola, Inc. (Phoenix, AZ) | 1N4007 |
| 573 | Zener diode, 7.5 V, 5 W | 1 | Motorola, Inc (Phoenix, AZ) | 1N4954 |

Figure 6:
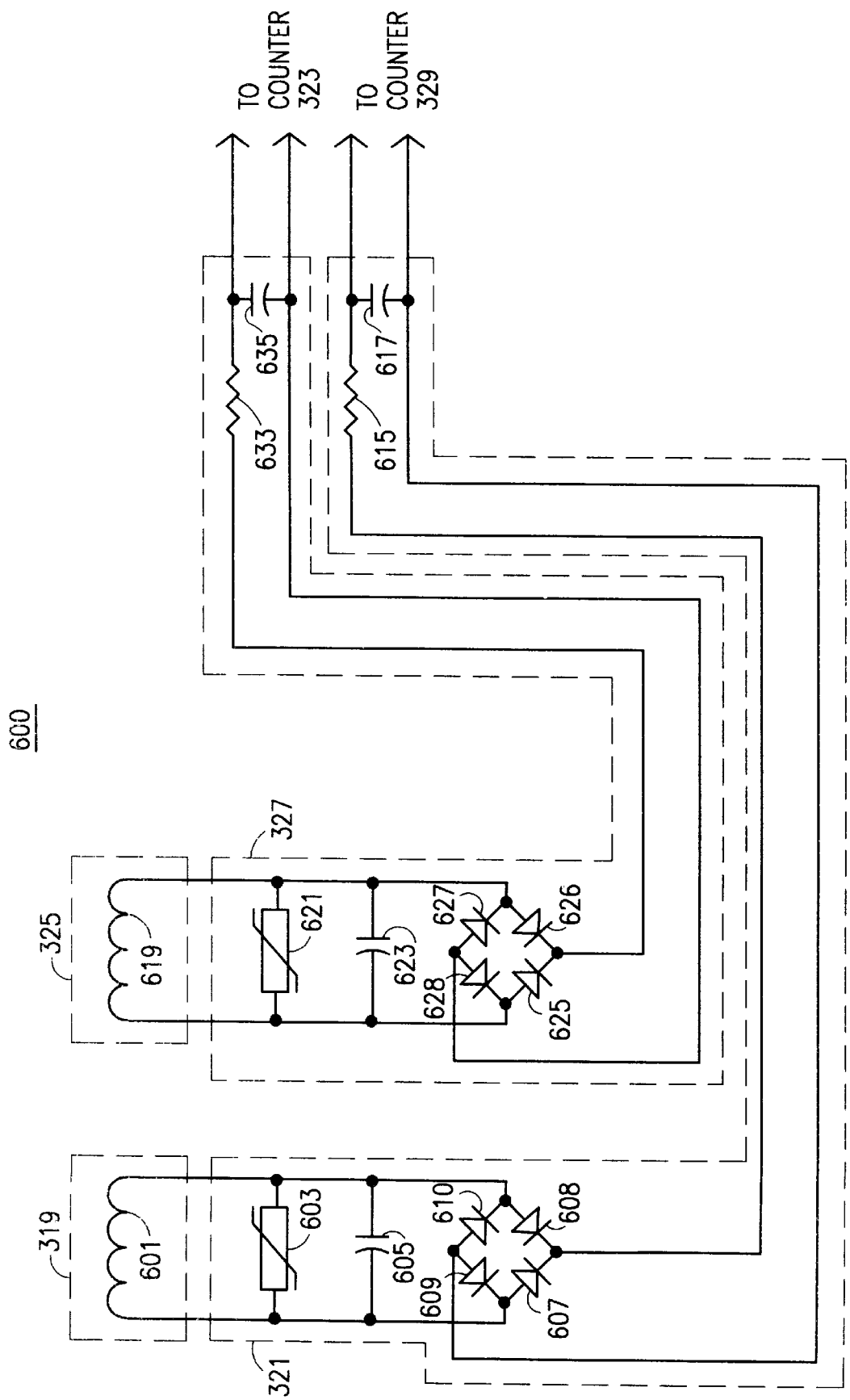
FIG. 6 is a schematic and block diagram of a current sensing portion of the preferred electrical surge protection apparatus of FIG. 3.

FIG. 6 is a schematic and block diagram of a current sensing portion 600 of the preferred electrical surge protection apparatus 300 of FIG. 3. The current sensing portion 600 includes the current sensing circuits 319, 325, and the signal generator circuits 321, 327. Each current sensing circuit 319, 325 preferably comprises an inductor 601, 619. Each signal generator circuit 321, 327 preferably comprises a varistor 603, 621 connected electrically in parallel with a capacitor 605, 623, four diodes 607–610, 625–628 connected to form a full wave bridge, a resistor 615, 633, and a capacitor 617, 635. The inductors 601, 619 of the current sensing circuits 319, 325 are positioned sufficiently close to conductor contacts 302 and 303 to enable a voltage to appear across one of the inductors 601, 619 in the event a surge current occurs in one of the conductors of the AC power distribution system. In the preferred embodiment, the inductors 601, 619 are positioned approximately five (5) millimeters above the conductor contacts 302, 303 and are oriented to receive magnetic fields resulting from transient currents in the conductor contacts 302, 303. The preferred location of the inductors 601, 619 is described in more detail below with respect to FIG. 8.

In the event a surge current occurs in one of the conductor contacts 302, 303, the surge current causes a rapidly changing magnetic field in the proximity of one of the inductors 601, 619. For example, a surge current in conductor contact 302 (evidencing a surge current in the corresponding conductor of the AC power distribution system) results in a time-varying magnetic field in the proximity of inductor 601. The magnetic field induces an AC voltage across the inductor (e.g., 601) and the associated varistor (e.g., 603) functions to limit the peak value of the induced AC voltage. The capacitor (e.g., 605) in parallel with the varistor 603 provides a first stage of filtering. The full wave bridge (e.g., diodes 607–610) converts the AC voltage into a DC voltage pulse. The resistor (e.g., 633) and capacitor (e.g. 635) coupled to the full wave bridge provide lowpass filtering before the voltage pulse is sent to the respective counter (e.g., 323). The counter 323 counts and preferably displays the number of surge current events until the counter 323 is reset by a system operator.

Table 3 below is a parts listing for the preferred current sensing portion 600 of FIG. 6.

TABLE 3

| Reference Numeral(s) | Description | Quantity | Manufacturer | Manufacturer's Part Number |
| --- | --- | --- | --- | --- |
| 601, 619 | 3.9 mH inductor | 2 | Dale Electronics, Inc. (Yankton, SD) | IMS5-3900 |
| 603, 621 | Metal oxide varistor | 2 | Harris (Melbourne, FL) | V151HA40 |
| 605, 623 | 0.01 μF capacitor, 100 V | 2 | Kemet Electronics Corp. (Greenville, SC) | C315C103K1R5CA |
| 607–610, 625–628 | Signal diode | 8 | Diodes, Inc. (Westlake Village, CA) | 1N4148 |
| 615, 633 | 4.7 kΩ resistor, ¼ watt | 2 | Xicon Passive Components (Arlington, TX) | 291-4.7K/AP |
| 617, 635 | 0.022 μF capacitor, 100 V | 2 | Panasonic Industrial Co. (Div. Of Matsushita Electric Corp. of America) (Secaucus, NJ) | ECU-S2A223KBA |

Figure 7:
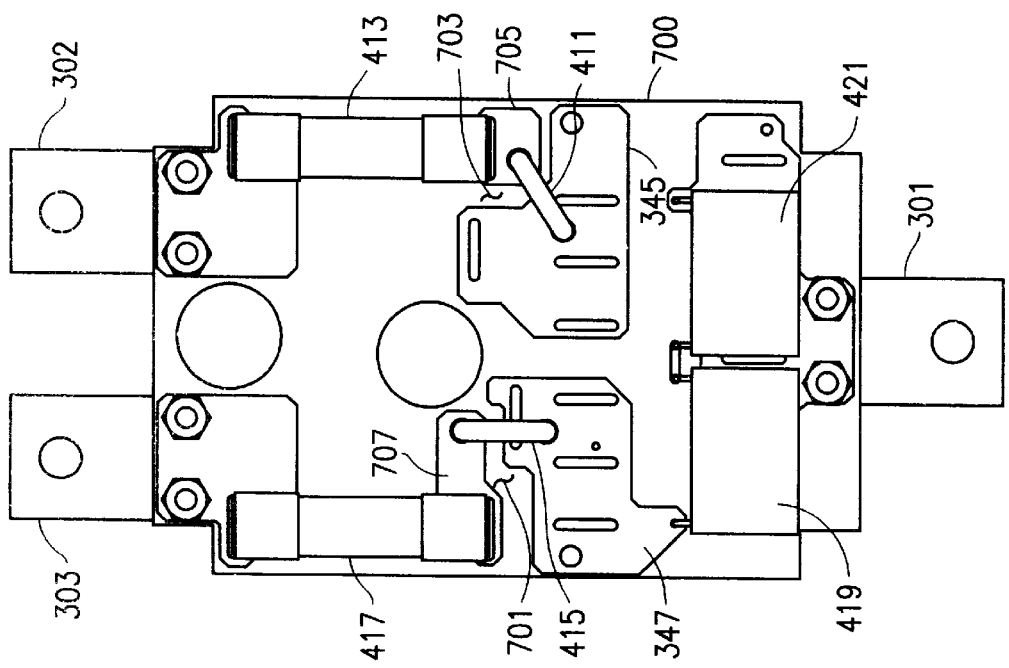
FIG. 7 is top and bottom plan views of a preferred printed circuit board layout for the electrical surge protection portion of FIG. 4.
Figure 7:
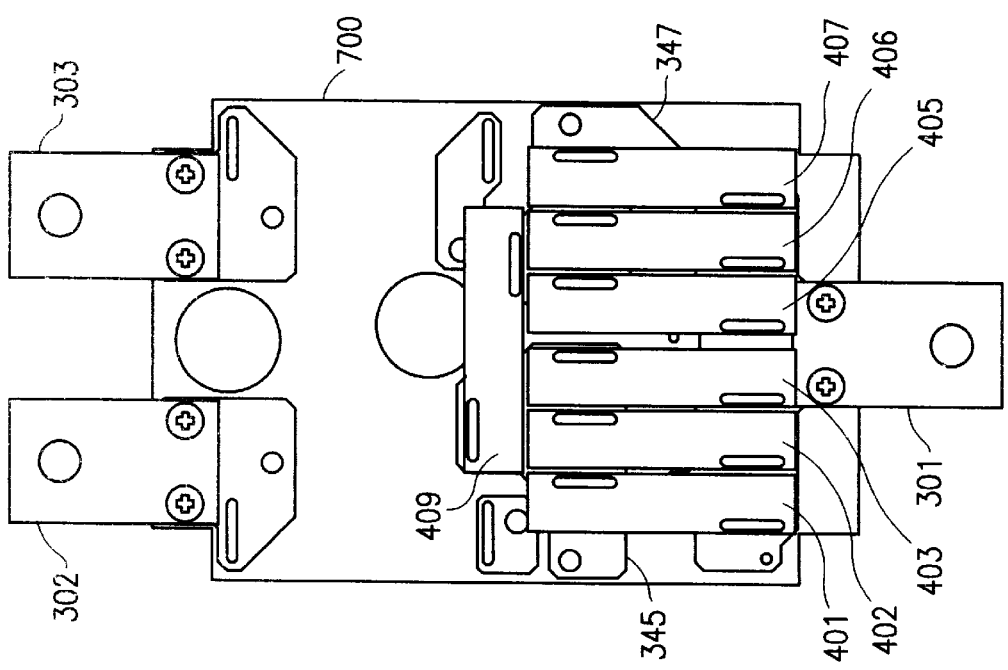

FIG. 7 is top and bottom plan views of a preferred printed circuit (PC) board 700 layout for the electrical surge protection portion 400 of FIG. 4. The views show the preferred orientations and PC board locations of the conductor contacts 301–303 and the elements of the electrical surge protection portion 400. In the preferred embodiment of the top side of the PC board 700, the varistors 401–403 forming SPD 331 are soldered at one end to the solder pad connected to conductor contact 301 and are soldered at the other end to solder pad 345. Similarly, the varistors 405–407 forming SPD 333 are soldered at one end to the solder pad connected to conductor contact 301 and are soldered at the other end to solder pad 347. The varistor 409 forming SPD 335 is soldered at one end to solder pad 345 and at the other end to solder pad 347.

In the preferred embodiment of the bottom side of the PC board 700, inverted-U shaped solder alloy member 411 is soldered at one end to solder pad 345 and at the other end to solder pad 705. Thus, solder alloy member 411 spans an electrically non-conductive gap 703 between solder pad 345 and solder pad 705. Similarly, inverted-U shaped solder alloy member 415 is soldered at one end to solder pad 347 and at the other end to solder pad 707. Thus, solder alloy member 415 spans an electrically non-conductive gap 701 between solder pad 347 and solder pad 707.

By soldering alloy member 411 at one end to the solder pad 345 to which one end of varistors 401–403 and 409 are also soldered, alloy member 411 is operably thermally coupled to the varistors 401–403, 409 through the solder connection. Therefore, due to the thermal conductivity of the solder, as one or more of the varistors 401–403, 409 heat, the alloy member 411 also heats. When the temperature of the alloy member 411 reaches a predetermined melting temperature (e.g., seventy-five degrees Celsius (75° C.)), the alloy member 411 melts and disintegrates under its own weight to open the circuit path connection (i.e., the electrically non-conductive gap 703 is no longer spanned by the alloy member 411). Since the alloy member 411 is preferably located on the bottom of the PC board 700, the melted alloy drops down due to gravitational forces only, away from the PC board 700. Thus, in contrast to prior art thermal protectors that require biasing action (i.e., non-gravitational forces) to open the circuit path upon melting of a solder alloy, the present invention utilizes only gravitational forces (i.e., the weight of the melted solder alloy member 411) to open the circuit path. In the preferred embodiment, the alloy member 411 is enclosed within a non-conductive cover (not shown) to contain the melted solder in the event that an undesired thermal condition occurs.

In a similar manner, by soldering alloy member 415 at one end to the solder pad 347 to which one end of varistors 405–407 and 409 are also soldered, alloy member 415 is operably thermally coupled to the varistors 405–407, 409 through the solder connection. Therefore, due to the thermal conductivity of the solder, as one or more of the varistors 405–407, 409 heat, the alloy member 415 also heats and the discussion above with respect to alloy member 411 also applies. In the preferred embodiment, because varistor 409 shares a solder pad 345, 347 with each alloy member 411, 415, the varistor 409 is operably thermally coupled to both alloy members 411, 415, and thereby is provided with redundant thermal protection.

Fuse 413 is soldered at one end to solder pad 705 and at the other end to the solder pad connected to conductor contact 302 to complete circuit path 305. Similarly, fuse 417 is soldered at one end to solder pad 707 and at the other end to the solder pad connected to conductor contact 303 to complete circuit path 307. Due to the preferred positioning and electrical connections of the fuses 413, 417 as shown in FIGS. 3, 4, and 7, the fuses 413, 417 also form part of circuit path 309 and provide redundant overcurrent protection to varistor 409.

Figure 8:
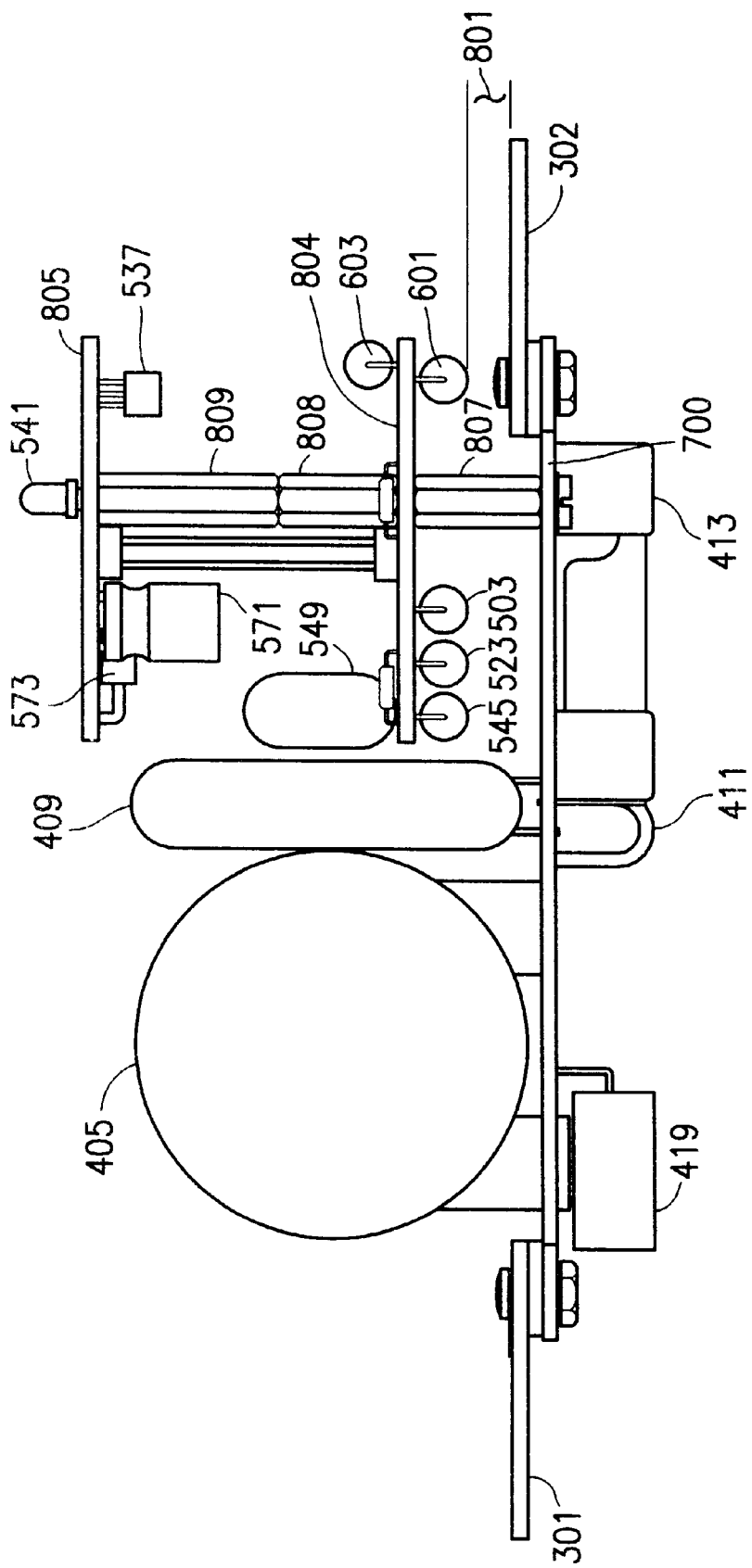
FIG. 8 is a right side elevational view of a preferred printed circuit board layout for the preferred electrical surge protection apparatus of FIG. 3.

FIG. 8 is a right side elevational view of a preferred PC board layout for the preferred electrical surge protection apparatus 300 of FIG. 3. The electrical surge protection apparatus 300 preferably includes three PC boards 700, 804, 805 that are stacked vertically and separated by spacers 807–809. The bottom PC board 700 preferably includes the circuit elements (only elements 411, 413, and 419 are shown) forming the preferred electrical surge protection portion 400 described above with respect to FIG. 7. The middle and top PC boards 804, 805 preferably include the circuit elements (only elements 405, 503, 523, 537, 541, 545, 549, 571, 573, 601, and 603 are shown) forming the continuity sensing circuits 311, 315, the indicator circuits 313, 317, the power supply 501, the current sensing circuits 319, 325, and the signal generator circuits 321, 327.

In addition to showing the number and orientation of the PC boards 700, 804, 805 constituting the preferred electrical surge protection apparatus 300. FIG. 8 depicts the preferred positioning of the inductors 601, 619 that form the preferred current sensing circuits 319, 325. In the preferred embodiment, as briefly describe above, each inductor 601 is separated from its respective conductor contact 302 by an air gap 801 of approximately five (5) millimeters. In addition, the coils of the inductor 601 are preferably oriented to be perpendicular to the flow of current in the conductor contact 302 for maximum magnetic field coupling between the conductor contact 302 and the inductor 601.

In the preferred embodiment, the electrical surge protection apparatus 300 is enclosed in a housing (not shown), such that portions of the conductor contacts 301–303 extend outside the housing body to permit coupling of the conductor contacts 301–303 to respective conductors of the AC power distribution system.

Figure 9:
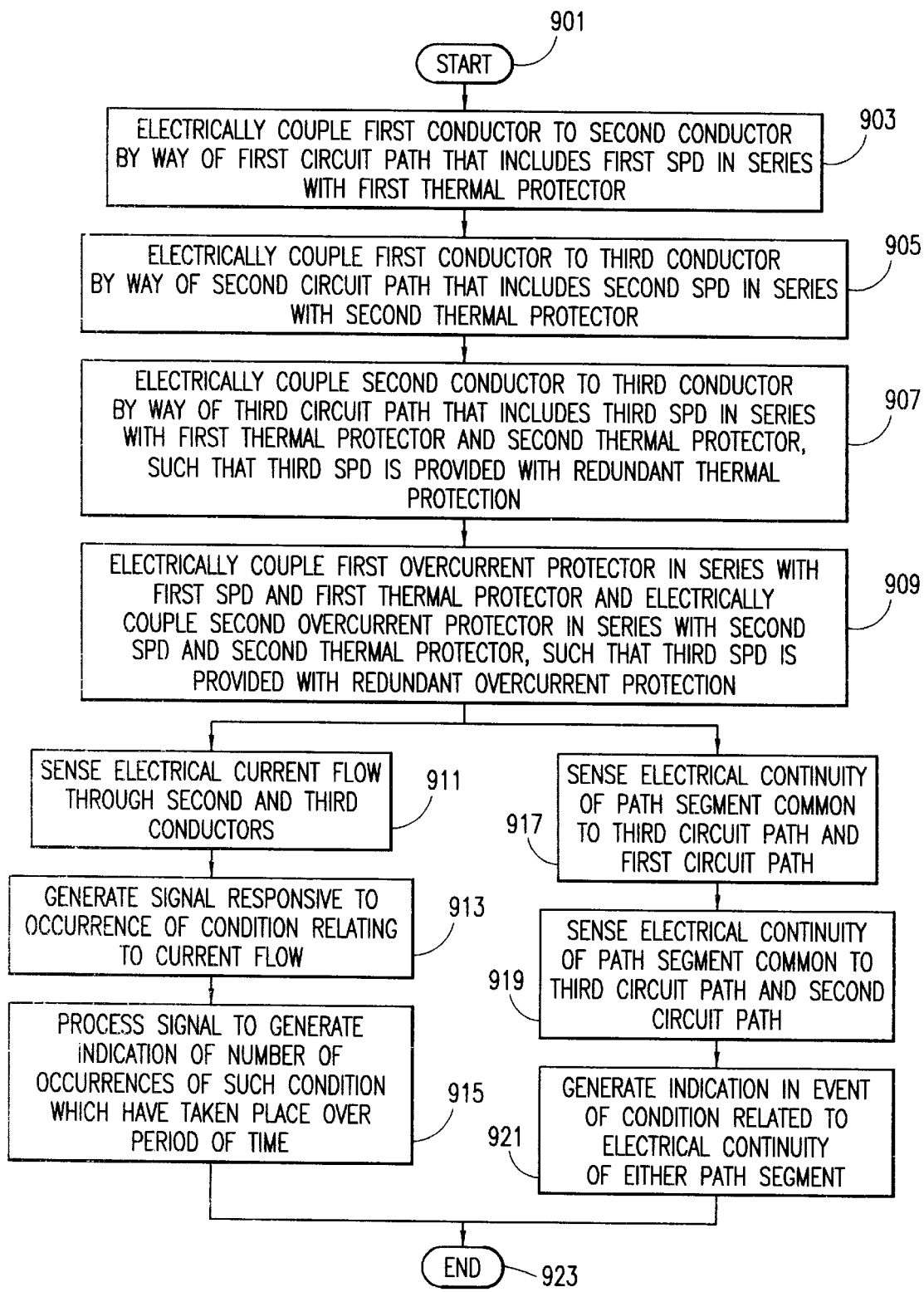
FIG. 9 is a logic flow diagram illustrating steps executed to provide electrical surge protection to an electrical load connected to an AC power distribution system in accordance with a preferred embodiment of the present invention.

FIG. 9 is a logic flow diagram 900 illustrating steps executed to provide electrical surge protection to an electrical load connected to an AC power distribution system in accordance with a preferred embodiment of the present invention. The logic flow begins (901) when a first conductor is electrically coupled (903) to a second conductor by way of a first circuit path 305 that includes a first SPD 331 electrically in series with a first thermal protector 337. The first conductor is also electrically coupled (905) to a third conductor by way of a second circuit path 307 that includes a second SPD 333 electrically in series with a second thermal protector 339. The second conductor is also electrically coupled (907) to the third conductor by way of a third circuit path 309 that includes a third SPD 335 electrically in series with the first thermal protector 337 and the second thermal protector 339, such that the third SPD 335 is provided with redundant thermal protection.

In addition to providing thermal protection in series with the SPDs 331, 333, 335 overcurrent protectors 341, 343 are preferably coupled electrically in series with the thermal protectors 337, 339. That is, a first overcurrent protector 341 is coupled (909) electrically in series with the first SPD 331 and the first thermal protector 337 and a second overcurrent protector 343 is coupled (909) electrically in series with the second SPD 333 and the second thermal protector 339. By coupling the overcurrent protectors 341, 343 to the first and second SPDs 331, 333 and the first and second thermal protectors 337, 339 in this manner, the third SPD 335 is preferably provided with redundant overcurrent protection because the third circuit path 307 includes both overcurrent protectors 341, 343.

In the preferred embodiment, the electrical coupling of blocks 903–909 is accomplished by connecting the preferred electrical surge protection apparatus 300 to three conductors of an AC power distribution system. That is, upon connecting the apparatus 300 to the AC power distribution system, the first conductor of the system is electrically coupled to the second conductor of the system by way of the first circuit path 305, the first conductor of the system is electrically coupled to the third conductor of the system by way of the second circuit path 307, and the second conductor of the system is electrically coupled to the third conductor of the system by way of the third circuit path 309. In an alternative embodiment, the electrical coupling of blocks 903–909 might be accomplished during assembly of a circuit in an AC power distribution system, wherein the circuit is similar in topology to the circuit topology employed by the preferred electrical surge protection apparatus 300.

After the SPDs 331, 333, 335, thermal protectors 337, 339, and overcurrent protectors 341, 343 have been electrically coupled together to form the circuit paths 303, 305, 307, and the circuit paths 303, 305, 307 electrically couple the conductors of the AC power distribution system together as discussed above, one or more diagnostic functions may be employed to detect faults or undesirable conditions present in the conductors or the circuit paths 303, 305, 307. In the preferred embodiment, the diagnostic functions of current sensing and circuit continuity sensing are employed.

To perform the current sensing function, the electrical current flow through the second and third conductors is sensed (911). In the preferred embodiment, such sensing is accomplished by inductively detecting surge currents in the conductor contacts 302, 303 that are connected to the second and third conductors. In the event that a transient overvoltage occurs resulting in a surge current through the SPD, a signal (e.g., a DC pulse) is generated (913) responsive to the occurrence of the surge current. The signal is then processed (915) to generate an indication of the number of occurrences of the surge current or other condition which have taken place over a period of time. For example, a counter may be used to process the signal and count the number of current surges that have occurred over the course of a twenty-four hour period.

To perform the circuit continuity sensing function, the electrical continuity of the path segment common to the first circuit path 303 and the third circuit path 309 is sensed (917). In the preferred embodiment, such path segment includes the first thermal protector 337 and the first overcurrent protector 341. The continuity sensing of this path segment is preferably accomplished by detecting the voltage (or lack thereof) across the first SPD 331. If no voltage is present across the first SPD 331, either the first thermal protector 337 or the first overcurrent protector 341 is in an open circuit condition. In addition to sensing the electrical continuity of the aforesaid path segment, the electrical continuity of the path segment common to the second circuit path 305 and the third circuit path 309 is also sensed (919). In the preferred embodiment, such path segment includes the second thermal protector 339 and the second overcurrent protector 343. The continuity sensing of this path segment is preferably accomplished by detecting the voltage (or lack thereof) across the second SPD 333. If no voltage is present across the second SPD 333, either the second thermal protector 339 or the second overcurrent protector 343 is in an open circuit condition. By sensing the electrical continuity of the common path segments, the present invention provides a technique for detecting faults in the third circuit path 309 (typically the neutral-to-ground circuit path).

In the event that a condition related to the electrical continuity of either path segment occurs (e.g., one or both of the path segments lack continuity), a humanly-perceptible indication ot such condition is generated (921). For example, if either the first thermal protector 337 or the first overcurrent protector 341 becomes open-circuited, lack of continuity exists in the path segment common to the first circuit path 305 and the third circuit path 309. In response to such lack of continuity, an LED is illuminated locally and/or remotely to indicate the lack of continuity in the path segment. The logic flow ends (923) upon completion of the selected diagnostic functions.

The present invention encompasses an apparatus and method for surge protecting an electrical load connected to an AC power distribution system. With this invention, fewer thermal protectors are necessary to thermally protect SPDs incorporated in surge protection apparatuses. In addition, even though fewer thermal protectors are used, redundant thermal protection is provided to one of the SPDs. Further, the present invention provides for overcurrent protection for all the SPDs and redundant overcurrent protection for one of the SPDs, while using fewer overcurrent protectors than prior art approaches that provide individualized overcurrent protection. Still further, the present invention provides for simple detection of faults in the neutral-to-ground circuit path of the surge protection apparatus, such detection being unavailable or at least very difficult in existing surge protection apparatuses. Finally, the present invention provides a thermal protector for use in surge protector circuits, wherein the thermal protector does not require both a mechanically biased element and a solder alloy as in the prior art, but rather uses only an alloy, thereby providing a more economical and reliable thermal protector.

While the foregoing constitute certain preferred and alternative embodiments of the present invention, it is to be understood that the invention is not limited thereto and that in light of the present disclosure, various other embodiments will be apparent to persons skilled in the art. Accordingly, it is to be recognized that changes can be made without departing from the scope of the invention as particularly pointed out and distinctly claimed in the appended claims which shall be construed to encompass all legal equivalents thereof.

What is claimed is:

1. An electrical surge protection apparatus coupleable to at least first, second, and third conductors of an alternating current power distribution system, said apparatus comprising:

a first circuit path electrically coupleable between the first conductor and the second conductor, said first circuit path including a first thermal protector electrically in series with and operably thermally coupled to a first surge protection device;

a second circuit path electrically coupleable between the first conductor and the third conductor, said second circuit path including a second thermal protector electrically in series with and operably thermally coupled to a second surge protection device; and a third circuit path electrically coupleable between the second conductor and the third conductor, said third circuit path including a third surge protection device electrically in series with and operably thermally coupled to at least one of said first thermal protector and said second thermal protector.

2. The electrical surge protection apparatus of claim 1, further comprising:

a first overcurrent protector included in at least said first circuit path, said first overcurrent protector being electrically in series with said first surge protection device and said first thermal protector; and a second overcurrent protector included in at least said second circuit path, said second overcurrent protector being electrically in series with said second surge protection device and said second thermal protector.

3. The electrical surge protection apparatus of claim 2, wherein said third circuit path further includes, electrically in series with said third surge protection device, at least one of said first overcurrent protector and said second overcurrent protector.

4. The electrical surge protection apparatus of claim 3, wherein said third surge protection device is electrically in series with and operably thermally coupled to both said first thermal protector and said second thermal protector and said third circuit path includes, electrically in series with said third surge protection device, both said first overcurrent protector and said second overcurrent protector.

5. The electrical surge protection apparatus of claim 1, wherein at least one of said first thermal protector and said second thermal protector comprises a member formed of an electrically conductive alloy having a predetermined melting point.

6. The electrical surge protection apparatus of claim 5, wherein said member comprises a length of solder wire.

7. The electrical surge protection apparatus of claim 5, wherein said alloy includes bismuth and has a melting temperature of less than about one hundred degrees Celsius.

8. The electrical surge protection apparatus of claim 1, wherein at least one of said first surge protection device, said second surge protection device, and said third surge protection device comprises at least two varistors electrically in parallel with one another.

9. The electrical surge protection apparatus of claim 1, wherein the first, second and third conductors comprise line, neutral and ground conductors, respectively.

10. The electrical surge protection apparatus of claim 1, wherein the first, second and third conductors comprise ground, neutral and line conductors, respectively.

11. The electrical surge protection apparatus of claim 1, wherein the first, second and third conductors comprise neutral, line and ground conductors, respectively.

12. The electrical surge protection apparatus of claim 1, wherein said first thermal protector comprises:

a member formed of an alloy which, during normal operation of said first surge protection device, remains in an electrically conductive, solid phase mounted substantially free of any non-gravitational biasing force to form an electrically and mechanically continuous conductive path and which, upon reaching a temperature attainable in the event of overheating of said first surge protection device, melts sufficiently to disintegrate adequately under its own weight to open at least said conductive path, whereby overheating of said first surge protection device is abated.

13. The electrical surge protection apparatus of claim 12, wherein said member comprises a length of solder wire.

14. The electrical surge protection apparatus of claim 12, wherein said alloy includes bismuth and has a melting temperature of less than about one hundred degrees Celsius.

15. The electrical surge protection apparatus of claim 12, wherein said conductive path comprises an electrically non-conductive gap spanned by said member.

16. The electrical surge protection apparatus of claim 1, wherein said second thermal protector comprises:

a member formed of an alloy which, during normal operation of said second surge protection device, remains in an electrically conductive, solid phase mounted substantially free of any non-gravitational biasing force to form an electrically and mechanically continuous conductive path and which, upon reaching a temperature attainable in the event of overheating of said second surge protection device, melts sufficiently to disintegrate adequately under its own weight to open at least said conductive path, whereby overheating of said second surge protection device is abated.

17. The electrical surge protection apparatus of claim 16, wherein said member comprises a length of solder wire.

18. The electrical surge protection apparatus of claim 16, wherein said alloy comprises tin, bismuth, cadmium, and lead.

19. The electrical surge protection apparatus of claim 16, wherein said conductive path comprises an electrically non-conductive gap spanned by said member.

20. The electrical surge protection apparatus of claim 1, further comprising:
   a continuity sensing circuit disposed in continuity sensing relation to a path segment common to both said third circuit path and at least one of said first circuit path and said second circuit path; and
   an indicator circuit coupled to said continuity sensing circuit for generating a humanly-perceptible indication in the event said continuity sensing circuit senses a predetermined condition related to electrical continuity of said path segment.

21. The electrical surge protection apparatus of claim 1, further comprising:
   a continuity sensing circuit disposed in a continuity sensing relation to at least one circuit path of said first circuit path and said second circuit path; and
   an indicator circuit coupled to said continuity sensing circuit for generating a humanly-perceptible indication in the event said continuity sensing circuit senses a predetermined condition related to electrical continuity of said at least one circuit path.

22. The electrical surge protection apparatus of claim 1, further comprising:
   a current sensing circuit disposed in current sensing relation to at least one conductor of the second conductor and the third conductor;
   a signal generator circuit coupled to said current sensing circuit, said signal generator circuit operating to generate a signal in response to said current sensing circuit sensing a predetermined condition relating to current flow in said at least one conductor; and
   a counter coupleable to said signal generator circuit, said counter processing said signal to generate an indication of the number of occurrences of said predetermined condition relating to current flow in said at least one conductor which have taken place over a period of time.

23. An electrical surge protection apparatus coupleable to at least first, second, and third conductors of an alternating current power distribution system, said apparatus comprising:
   a first circuit path electrically coupleable between the first conductor and the second conductor, said first circuit path including a first surge protection device electrically in series with a first overcurrent protector;
   a second circuit path electrically coupleable between the first conductor and the third conductor, said second circuit path including a second surge protection device electrically in series with a second overcurrent protector; and
   a third circuit path electrically coupleable between the second conductor and the third conductor, said third circuit path including a third surge protection device electrically in series with said first overcurrent protector and said second overcurrent protector.

24. The electrical surge protection apparatus of claim 23, further comprising:
   a first thermal protector included in at least said first circuit path, said first thermal protector being electrically in series with and operably thermally coupled to said first surge protection device, and
   a second thermal protector included in at least said second circuit path, said second thermal protector being electrically in series with and operably thermally coupled to said second surge protection device.

25. The electrical surge protection apparatus of claim 24, wherein said third circuit path further includes, electrically in series with and operably thermally coupled to said third surge protection device, at least one of said first thermal protector and said second thermal protector.

26. The electrical surge protection apparatus of claim 25, wherein said third surge protection device is operably thermally coupled to and electrically in series with both said first thermal protector and said second thermal protector.

27. The electrical surge protection apparatus of claim 24, wherein at least one of said first thermal protector and said second thermal protector comprises a member formed of an electrically conductive alloy having a predetermined melting point.

28. The electrical surge protection apparatus of claim 27, wherein said member comprises a length of solder wire.

29. The electrical surge protection apparatus of claim 27, wherein said alloy includes bismuth and has a melting temperature of less than about one hundred degrees Celsius.

30. The electrical surge protection apparatus of claim 24, wherein said first thermal protector comprises:
   a member formed of an alloy which, during normal operation of said first surge protection device, remains in an electrically conductive, solid phase mounted substantially free of any non-gravitational biasing force to form an electrically and mechanically continuous conductive path and which, upon reaching a temperature attainable in the event of overheating of said first surge protection device, melts sufficiently to disintegrate adequately under its own weight to open at least said conductive path, whereby overheating of said first surge protection device is abated.

31. The electrical surge protection apparatus of claim 30, wherein said member comprises a length of solder wire.

32. The electrical surge protection apparatus of claim 30, wherein said alloy comprises tin, bismuth, cadmium, and lead.

33. The electrical surge protection apparatus of claim 30, wherein said conductive path comprises an electrically non-conductive gap spanned by said member.

34. The electrical surge protection apparatus of claim 24, wherein said second thermal protector comprises:
   a member formed of an alloy which, during normal operation of said second surge protection device, remains in an electrically conductive, solid phase mounted substantially free of any non-gravitational biasing force to form an electrically and mechanically continuous conductive path and which, upon reaching a temperature attainable in the event of overheating of said second surge protection device, melts sufficiently to disintegrate adequately under its own weight to open at least said conductive path, whereby overheating of said second surge protection device is abated.

35. The electrical surge protection apparatus of claim 34, wherein said member comprises a length of solder wire.

36. The electrical surge protection apparatus of claim 34, wherein said alloy comprises tin, bismuth, cadmium, and lead.

37. The electrical surge protection apparatus of claim 34, wherein said conductive path comprises an electrically non-conductive gap spanned by said member.

38. The electrical surge protection apparatus of claim 23, wherein at least one of said first surge protection device, said second surge protection device, and said third surge protection device comprises at least two varistors electrically in parallel with one another.

39. The electrical surge protection apparatus of claim 23, wherein the first, second and third conductors comprise line, neutral and ground conductors, respectively.

40. The electrical surge protection apparatus of claim 23, wherein the first, second and third conductors comprise ground, neutral and line conductors, respectively.

41. The electrical surge protection apparatus of claim 23, wherein the first, second and third conductors comprise neutral, line and ground conductors, respectively.

42. The electrical surge protection apparatus of claim 23, further comprising:

a continuity sensing circuit disposed in continuity sensing relation to a path segment common to both said third circuit path and at least one of said first circuit path and said second circuit path; and an indicator circuit coupled to said continuity sensing circuit for generating a humanly-perceptible indication in the event said continuity sensing circuit senses a predetermined condition related to electrical continuity of said path segment.

43. The electrical surge protection apparatus of claim 23, further comprising:

a continuity sensing circuit disposed in a continuity sensing relation to at least one circuit path of said first circuit path and said second circuit path; and an indicator circuit coupled to said continuity sensing circuit for generating a humanly-perceptible indication in the event said continuity sensing circuit senses a predetermined condition related to electrical continuity of said at least one circuit path.

44. The electrical surge protection apparatus of claim 23, further comprising:

a current sensing circuit disposed in current sensing relation to at least one conductor of the second conductor and the third conductor;

a signal generator circuit coupled to said current sensing circuit, said signal generator circuit operating to generate a signal in response to said current sensing circuit sensing a predetermined condition relating to current flow in said at least one conductor, and a counter coupleable to said signal generator circuit, said counter processing said signal to generate an indication of the number of occurrences of said predetermined condition relating to current flow in said at least one conductor which have taken place over a period of time.

45. A method for surge protecting an electrical load connected to an alternating current power distribution system of a type having at least first, second and third conductors, said method comprising the steps of:

electrically coupling the first conductor to the second conductor by way of a first circuit path, said first circuit path including a first surge protection device electrically in series with and operably thermally coupled to a first thermal protector;

electrically coupling the first conductor to the third conductor by way of a second circuit path, said second circuit path including a second surge protection device electrically in series with and operably thermally coupled to a second thermal protector; and electrically coupling the second conductor to the third conductor by way of a third circuit path, said third circuit path including a third surge protection device electrically in series with and operably thermally coupled to at least one of said first thermal protector and said second thermal protector.

46. The method of claim 45, wherein the step of electrically coupling the second conductor to the third conductor comprises the step of:

operably thermally coupling said third surge protection device to said first thermal protector and to said second thermal protector, whereby said third surge protection device is provided with redundant thermal protection.

47. The method of claim 45, further comprising the step of:

including in said third circuit path, electrically in series with said third surge protection device, a first overcurrent protector and a second overcurrent protector, whereby said third surge protection device is provided with redundant overcurrent protection.

48. The method of claim 45, further comprising the steps of:

electrically coupling a first overcurrent protector to at least said first circuit path, said first overcurrent protector being electrically in series with both said first surge protection device and said first thermal protector; and electrically coupling a second overcurrent protector to at least said second circuit path, said second overcurrent protector being electrically in series with both said second surge protection device and said second thermal protector.

49. The method of claim 48, further comprising the step of:

electrically coupling to said third circuit path, electrically in series with said third surge protection device, at least one of said first overcurrent protector and said second overcurrent protector.

50. The method of claim 45, wherein the first, second and third conductors comprise line, neutral and ground conductors, respectively.

51. The method of claim 45, wherein the first, second and third conductors comprise ground, neutral and line conductors, respectively.

52. The method of claim 45, wherein the first, second and third conductors comprise neutral, line and ground conductors, respectively.

53. The method of claim 45, further comprising the steps of:

sensing electrical current flow in at least one of the second conductor and the third conductor to produce a sensed conductor;

generating a signal responsive to occurrence of a predetermined condition relating to current flow in the sensed conductor; and processing said signal to generate an indication of the number of occurrences of said predetermined condition relating to current flow in the sensed conductor which have taken place over a period of time.

54. The method of claim 45, further comprising the steps of:

sensing electrical continuity of a path segment common to both said third circuit path and at least one of said first circuit path and said second circuit path; and generating a humanly-perceptible indication in the event of a predetermined condition related to electrical continuity of said path segment.

55. A method for surge protecting an electrical load connected to an alternating current power distribution system of a type having at least first second and third conductors, said method comprising the steps of:

electrically coupling the first conductor to the second conductor by way of a first circuit path, said first circuit path including a first surge protection device electrically in series with a first overcurrent protector;

electrically coupling the first conductor to the third conductor by way of a second circuit path, said second circuit path including a second surge protection device electrically in series with a second overcurrent protector; and electrically coupling the second conductor to the third conductor by way of a third circuit path, said third circuit path including a third surge protection device electrically in series with both said first overcurrent protector and said second overcurrent protector.

56. The method of claim 55, further comprising the step of:

including in said third circuit path, electrically in series with and operably thermally coupled to said third surge protection device, a first thermal protector and a second thermal protector, whereby said third surge protection device is provided with redundant thermal protection.

57. The method of claim 55, further comprising the steps of:

coupling a first thermal protector electrically in series with both said first surge protection device and said first overcurrent protector, such that said first thermal protector is operably thermally coupled to said first surge protection device; and coupling a second thermal protector electrically in series with both said second surge protection device and said second overcurrent protector, such that said second thermal protector is operably thermally coupled said second surge protection device.

58. The method of claim 57, wherein the step of electrically coupling the second conductor to the third conductor comprises the step of:

coupling at least one of said first thermal protector and said second thermal protector electrically in series with said third surge protection device, such that said third surge protection device is operably thermally coupled to at least one of said first thermal protector and said second thermal protector.

59. The method of claim 58, wherein the step coupling at least one of said first thermal protector and said second thermal protector electrically in series with said third surge protection device comprises the step of:

coupling both said first thermal protector and said second thermal protector electrically in series with said third surge protection device, such that said third surge protection device is operably thermally coupled to both said first thermal protector and said second thermal protector, whereby said third surge protection device is provided with redundant thermal protection.

60. The method of claim 55, wherein the first, second and third conductors comprise line, neutral and ground conductors, respectively.

61. The method of claim 55, wherein the first, second and third conductors comprise ground, neutral and line conductors, respectively.

62. The method of claim 55, wherein the first, second and third conductors comprise neutral, line and ground conductors, respectively.

63. The method of claim 55, further comprising the steps of:

sensing electrical current flow in at least one of the second conductor and the third conductor to produce a sensed conductor;

generating a signal responsive to occurrence of a predetermined condition relating to current flow in the sensed conductor; and processing said signal to generate an indication of the number of occurrences of said predetermined condition relating to current flow in the sensed conductor which have taken place over a period of time.

64. The method of claim 55, further comprising the steps of:

sensing electrical continuity of a path segment common to both said third circuit path and at least one of said first circuit path and said second circuit path; and generating a humanly-perceptible indication in the event of a predetermined condition related to electrical continuity of said path segment.

65. An electrical surge protection apparatus coupleable to an alternating current power distribution system having at least a first conductor and a second conductor, said apparatus comprising:

at least one surge protection device and at least one thermal protector operably thermally coupled to said surge protection device, said surge protection device and said thermal protector being electrically in series with one another to form a circuit path electrically coupleable between the first conductor and the second conductor, said thermal protector including a member formed of an alloy which, during normal operation of said surge protection device, remains in an electrically conductive, solid phase mounted substantially free of any non-gravitational biasing force to form an electrically and mechanically continuous part of said circuit path and which member, upon reaching a temperature attainable in the event of overheating of said surge protection device, melts sufficiently to disintegrate adequately under its own weight to open said circuit path, whereby overheating of said surge protection device is abated.

66. The electrical surge protection apparatus of claim 65, wherein said member comprises a length of solder wire.

67. The electrical surge protection apparatus of claim 65, wherein said alloy comprises tin, bismuth, cadmium, and lead.

68. The electrical surge protection apparatus of claim 65, wherein said circuit path comprises an electrically non-conductive gap spanned by said member.

69. The electrical surge protection apparatus of claim 65, wherein said alloy has a melting temperature of less than about one hundred degrees Celsius.

* * * * *